United States Patent [19]
Takimoto et al.

[11] Patent Number: 6,114,740
[45] Date of Patent: Sep. 5, 2000

[54] CIRCUIT-INTEGRATING LIGHT-RECEIVING ELEMENT

[75] Inventors: Takahiro Takimoto; Naoki Fukunaga, both of Tenri; Masaru Kubo, Kitakatsuragi-gun, all of Japan

[73] Assignee: Sharp Kabushiki Kaisha, Osaka, Japan

[21] Appl. No.: 08/944,101

[22] Filed: Sep. 30, 1997

[30] Foreign Application Priority Data

Sep. 30, 1996 [JP] Japan ................................ 8-260043

[51] Int. Cl.⁷ .......................... A01L 31/06; H01L 31/00
[52] U.S. Cl. .................... 257/461; 257/462; 257/463; 257/464; 257/443; 257/444
[58] Field of Search .................. 257/461, 443, 257/444, 462, 463, 464

[56] References Cited

U.S. PATENT DOCUMENTS

| | | | |
|---|---|---|---|
| 5,177,581 | 1/1993 | Kubo et al. | |
| 5,360,987 | 11/1994 | Shibib | 257/446 |
| 5,418,396 | 5/1995 | Mita | 257/461 |
| 5,767,538 | 6/1998 | Mullins et al. | 257/115 |
| 5,825,071 | 10/1998 | Takakura | 257/440 |

FOREIGN PATENT DOCUMENTS

| | | |
|---|---|---|
| 0 576 009 | 12/1993 | European Pat. Off. |
| 0 621 639 | 10/1994 | European Pat. Off. |
| 0 693 785 | 1/1996 | European Pat. Off. |
| 63-122164 | 5/1988 | Japan . |
| 4-82268 | 3/1992 | Japan . |
| 8-32100 | 2/1996 | Japan . |

OTHER PUBLICATIONS

Patent Abstract of Japan, vol. 14, No. 564 (E–1013), Dec. 14, 1990 and JP 2–246168.

*Primary Examiner*—Mahshid Saadat
*Assistant Examiner*—Jesse A. Fenty
*Attorney, Agent, or Firm*—Nixon & Vanderhye P.C.

[57] ABSTRACT

The circuit-integrating light-receiving element of this invention includes: a semiconductor substrate of a first conductivity type; a first semiconductor layer of a second conductivity type formed over the semiconductor substrate; a first semiconductor layer of the first conductivity type for dividing the first semiconductor layer into semiconductor regions of the second conductivity type; light-detecting sections being constituted by the divided semiconductor regions and underlying regions of the semiconductor substrate, a divided photodiode being composed of the light-detecting sections; a second semiconductor layer of the second conductivity type formed only in the vicinity of the first semiconductor layer of the first conductivity type functioning as a division section of the divided photodiode and within the regions of the semiconductor substrate forming the respective light-detecting sections; and a second semiconductor layer of the first conductivity type formed in a surface region of the first semiconductor layer of the second conductivity type including the division section so as to cover an upper part of the second semiconductor layer of the second conductivity type.

9 Claims, 13 Drawing Sheets

(N-type diffusion layer 3a: ▨)
(P-type diffusion layer 6a: ▦)

CIRCUIT-INTEGRATING LIGHT-RECEIVING ELEMENT

BACKGROUND OF THE INVENTION

1. Field of the Invention

The present invention relates to a circuit-integrating light-receiving element integrating a signal processor circuit for processing a photoelectrically converted signal. More particularly, the present invention relates to a divided photodiode structure which is incorporated into the circuit-integrating light-receiving element and has a light-receiving region divided into a plurality of light-detecting sections (hereinafter, referred to as "light-detecting photodiode sections") for reducing the level of radio frequency noise thereof without decreasing the response speed thereof.

2. Description of the Related Art

Such a circuit-integrating light-receiving element provided with a divided photodiode has conventionally been used as a signal detecting element for an optical pickup, for example.

FIGS. 10A and 10B illustrate a conventional circuit-integrating light-receiving element: FIG. 10A is a plan view showing a general configuration of a quadruple divided photodiode of the circuit-integrating light-receiving element, and FIG. 10B is a view showing a cross-sectional structure thereof taken along the line 10b—10b in FIG. 10A. It is noted that various components including multi-layer wires, a protective film and the like to be formed during the respective steps succeeding a metal processing step are omitted from FIGS. 10A and 10B.

In FIGS. 10A and 10B, PD20 is a quadruple divided photodiode incorporated into a conventional circuit-integrating light-receiving element, and an N-type epitaxial layer 14 is formed on a P-type semiconductor substrate 11 thereof. In the boundary region between the substrate 11 and the N-type epitaxial layer 14, a P$^+$-type buried diffusion layer 12 is selectively formed. In the surface region of the N-type epitaxial layer 14, a P$^+$-type isolating diffusion layer 15 is formed so as to reach the P$^+$-type buried diffusion layer 12. Moreover, the N-type epitaxial layer 14 is divided into a plurality of N-type epitaxial regions 14a by the P$^+$-type buried diffusion layer 12 and the P$^+$-type isolating diffusion layer 15 linked with the diffusion layer 12. Herein, light-detecting photodiode sections PDa, PDb, PDc and PDd for detecting signal light are formed by the respectively divided N-type epitaxial regions 14a and the underlying regions of the substrate 11. And the quadruple divided photodiode PD20 is made up of these light-detecting photodiode sections PDa to PDd. In actuality, an antireflection film such as a silicon oxide film or a silicon nitride film is formed over the surface of the N-type epitaxial layer 14. However, for the sake of simplicity, such a film is not shown in FIG. 10B.

Next, a method for detecting a focus error using the quadruple divided photodiode PD20 will be described.

FIGS. 11A through 11C illustrate the appearances of light beam spots formed on the surface of the quadruple divided photodiode PD20 upon the irradiation of signal light thereto in an astigmatism method as an exemplary method for detecting a focus error using the quadruple divided photodiode PD20 consisting of the light-detecting photodiode sections PDa through PDd.

FIG. 11A illustrates the shape of a light spot formed on the surface of the quadruple divided photodiode when the light beam incoming from an optical pickup is in focus on a disk, FIG. 11B illustrates the shape of a light spot formed on the surface of the quadruple divided photodiode when a distance between the disk and the optical pickup is too small, and FIG. 11C illustrates the shape of a light spot formed on the surface of the quadruple divided photodiode when the distance between the disk and the optical pickup is too large.

In general, a focus error is detected by obtaining the respective sums of the optical signals (i.e., photoelectrically converted outputs) of two pairs of light-detecting photodiode sections located on the diagonals and then examining a difference between the two sum signals thus obtained. Specifically, in this case, the error signal S is calculated as follows:

Error signal S={(optical signal of light-detecting photodiode section PDa)+(optical signal of light-detecting photodiode section PDd)}−{(optical signal of light-detecting photodiode section PDb)+(optical signal of light-detecting photodiode section PDc)}

For example, when a circular light spot 10a is formed as shown in FIG. 11A, S=0 and it is determined that the light beam is in focus on the disk. On the other hand, when an ellipsoidal light spot 10b inclined counterclockwise with respect to the vertical direction of the divided photodiode is formed as shown in FIG. 11B, S>0 and it is determined that the disk is too close to the optical pickup. Furthermore, when an ellipsoidal light spot 10c inclined clockwise with respect to the vertical direction of the divided photodiode is formed as shown in FIG. 11C, S<0 and it is determined that the disk is too distant from the optical pickup.

When an optical pickup is actually used, a focusing control is performed on a light beam so that S=0. Thus, as shown in FIGS. 11A through 11C, the light beam of signal light is irradiated onto the division section of the divided photodiode.

After the focal distance from the optical pickup to the disk has been adjusted in such a manner, an RF signal including data actually read out from the disk is obtained as the sum of the optical signals (photoelectrically converted signals) from the respective light-detecting photodiode sections in the state where the light beam is irradiated onto the divided photodiode as shown in FIG. 11A. That is to say, RF signal={(optical signal of light-detecting photodiode section PDa)+(optical signal of light-detecting photodiode section PDd)}+{(optical signal of light-detecting photodiode section PDb)+(optical signal of light-detecting photodiode section PDc)}

Furthermore, in order to realize high-speed signal processing, irradiated signal light must be converted into an electrical signal at a high speed in a divided photodiode. Thus, as the performance of optical disk drives has been increasingly improved, the response characteristics of a divided photodiode are required to be further improved in an area where signal light is irradiated when the divided photodiode is actually used.

As a result of the need to improve the response characteristics of the division section of a divided photodiode in a state where light is irradiated onto the divided photodiode as shown in FIG. 11A, a structure for improving the response speed in the division section has already been developed (see Japanese Laid-Open Publication No. 8-32100 (Japanese Patent Application No. 6-162412)).

FIG. 12 is a view for illustrating such a structure for improving the response speed in the division section and shows a cross-sectional structure corresponding to the part of a quadruple divided photodiode PD20 shown in FIG. 10B. It is noted that an oxide film or a nitride film as an antireflection film and various components including multi-layer wires, a protective film and the like to be formed during the respective steps succeeding a metal processing step are omitted from FIG. 12.

In FIG. 12, PD30 is a quadruple divided photodiode having such a structure as to improve the response speed in the division section. The divided photodiode PD30 further includes an N$^+$-type buried diffusion layer 13 formed in the boundary region between the P-type silicon substrate 11 and the N-type epitaxial regions 14a constituting the respective light-detecting photodiode sections PDa through PDd, in addition to the respective layers and regions of the divided photodiode PD20 shown in FIGS. 10A and 10B. The remaining configuration of the divided photodiode PD30 is the same as that of the divided photodiode PD20.

Next, a method for fabricating this divided photodiode PD30 will be described.

First, as shown in FIG. 13A, a P$^+$-type buried diffusion layer 12 is formed in the regions for isolating the divided photodiode from other devices and the region to be the division section among the light-detecting photodiode sections of the divided photodiode in the surface region of the P-type silicon substrate 11. In addition, an N$^+$-type buried diffusion layer 13 is formed in a part of the regions in which the light-detecting photodiode sections are to be formed in the surface region of the substrate 11.

Next, as shown in FIG. 13B, an N-type epitaxial layer 14 is grown over the entire surface of the P-type silicon substrate 11. Subsequently, as shown in FIG. 13C, a P$^+$-type isolating diffusion layer 15 is formed in the regions corresponding to the P$^+$-type buried diffusion layer 12 so as to expand from the surface of the N-type epitaxial layer 14 and to reach the P$^+$-type buried diffusion layer 12, and a P$^+$-type diffusion layer 16 is further formed in the surface region of the N-type epitaxial layer 14 constituting the divided photodiode.

In this way, the divided photodiode PD30 having a structure such as that shown in FIG. 12 is obtained. Furthermore, a signal processor circuit section (not shown) to be incorporated, together with the divided photodiode, into the circuit-integrating light-receiving element is formed on the P-type silicon substrate 11 by a conventional bipolar IC process.

Next, it will be briefly described how the response characteristics are improved in the division section of the divided photodiode having such a structure.

The divided photodiode PD30 having this structure is characterized by providing the N$^+$-type buried diffusion layer 13 for the respective light-detecting photodiode sections and providing the P$^+$-type diffusion layer 16 in the surface region of the N-type epitaxial layer 14 constituting the divided photodiode.

First, the reasons why the N$^+$-type buried diffusion layer 13 is provided will be described. In the conventional structure for the divided photodiode PD20 shown in FIG. 10B, optical carriers C0 (see FIG. 14A), which have been generated under the division section B to be irradiated with light, reach a P-N junction region after the carriers have made a detour around the division section B. As a result, the distance over which the carriers C0 move by diffusion to the P-N junction region becomes longer than that of optical carriers C1 generated in the regions of the substrate 11 except for the regions under the division section B of the divided photodiode. Consequently, the response speed in the division section B of the divided photodiode PD20 becomes lower than the response speed in the regions other than the division section B and the cutoff frequency in the division section B becomes lower than the cutoff frequency of the regions other than the division section B.

In contrast, in the divided photodiode PD30 having the structure including the N$^+$-type diffusion layer 13 as shown in FIG. 13C utilizes a depletion layer expanding from the N$^+$-type diffusion layer 13, thereby shortening the distance, over which the optical carriers generated under the division section make a detour to diffuse around the division section, from several tens of $\mu$m to several $\mu$m. Consequently, the delay of the response speed owing to the optical carriers generated under the division section can be prevented.

From a viewpoint of improving the response speed, it is significant for the divided photodiode PD30 having such a structure to include the N$^+$-type diffusion layer 13 in the vicinity of the division section. By modifying the structure of the divided photodiode in such a manner, the response speed can be improved and an RF signal can be processed at a higher speed.

On the other hand, the reasons why the P$^+$-type diffusion layer 16 is formed are as follows.

In the case where the light reflectance of the light-receiving surface of the divided photodiode PD30 is high, when signal light is irradiated onto the divided photodiode PD30, smaller amount of light permeates into the divided photodiode PD30. As a result, the amount of current generated by the photoelectric conversion of light into electrical signals becomes smaller. In other words, the photosensitivity of the divided photodiode is decreased.

Thus, in order to prevent the photosensitivity from being decreased in such a manner, it is necessary to decrease the light reflectance on the surface of the divided photodiode. Thus, a silicon oxide film has conventionally been formed as an antireflection film (not shown) on the light-receiving surface of a divided photodiode. However, even if the film thickness of a silicon oxide film is optimized, the silicon oxide film can reduce the reflectance at most to about 15% because of the limitations of the refractive index thereof.

On the other hand, in the case of substituting a silicon nitride film for the silicon oxide film as the antireflection film, the reflectance can be reduced to about 1% by optimizing the film thickness thereof. However, if a silicon nitride film is formed on the surface of the epitaxial layer, then the P-N junction end face between the N-type epitaxial layer 14 and the P$^+$-type diffusion layer 15 is in direct contact with the silicon nitride film, so that junction leakage is adversely increased in the P-N junction end face.

Thus, by forming the P$^+$-type diffusion layer 16 in the surface region of the epitaxial layer in the divided photodiode as shown in FIG. 14C, it is possible to prevent the P-N junction end face between the N-type epitaxial layer 14 and the P$^+$-type diffusion layer 15 from coming into contact with the silicon nitride film, thereby taking measures against the junction leakage in the P-N junction end face.

Hereinafter, the problems of the divided photodiode PD30 having such a structure as that shown in FIG. 14C will be described.

As the operating speed of a divided photodiode used for an optical pickup becomes higher, a signal is processed by a circuit for processing a photoelectrically converted signal obtained by the divided photodiode at a higher frequency. Thus, it is necessary to reduce the level of radio frequency noise in the signal processor circuit of a circuit-integrating light-receiving element.

It has been found that the larger the capacitance of a divided photodiode is, the higher the level of radio frequency noise becomes. The reasons thereof are presumably as follows.

FIG. 15 is a simplified equivalent circuit diagram showing the circuit configuration of a circuit-integrating light-receiving element used for an optical pickup so as to include the components involved with radio frequency noise. In the circuit-integrating light-receiving element, a feedback circuit is provided on a prior stage for a signal processor circuit SC such as an amplifier. Thus, in this equivalent circuit diagram, a capacitance $C_{PD}$ of the divided photodiode and a resistance Rf of the feedback circuit are connected in parallel to the input of the signal processor circuit SC. In FIG. 15, V denotes a reference voltage of the signal processor circuit SC such as an amplifier.

The noise in such an equivalent circuit can be represented by the following Equation (1).

$$i_n^2 = i_{na}^2 + v_{na}^2/\{Rf^2/(1+\omega C_{PD} Rf^2)\} + 4kT(\Delta f/Rf) \quad (1)$$

In this Equation (1), the variables and the constants are as follows.

$i_n$: output current of an input-converted noise current source with respect to the entire signal processor circuit (complex number)

$i_{na}$: output current of the input-converted noise current source with respect to the feedback circuit (complex number)

$v_{na}$: output voltage of an input-converted noise voltage source with respect to the feedback circuit (complex number)

$\Delta f$: frequency band of a signal to be processed by the signal processor circuit Rf: resistance of the feedback circuit (feedback resistance)

$C_{PD}$: capacitance of the photodiode k: Boltzmann constant

T: absolute temperature $\omega=2\pi f$: angular velocity (rad/sec.)

f: frequency of optical signal

In this equation, the first term represents a shot noise, the second term represents radio frequency noise, and the third term represents a thermal noise. Among these terms, the shot noise and the thermal noise do not depend on a frequency.

As can be understood from Equation (1), the second term having a frequency dependence depends upon the load resistance Rf and the capacitance $C_{PD}$ of the divided photodiode. However, since the load resistance Rf is associated with the amplification factor of the amplifier circuit (i.e., the signal processor circuit) SC, the value of the resistance cannot be varied freely. Thus, in order to reduce the level of the radio frequency noise, it is necessary to reduce the capacitance $C_{PD}$ of the divided photodiode PD30.

As described above, in the conventional divided photodiode PD30, the response speed can be improved by providing the $N^+$-type buried diffusion layer 13 and the reflectance on the light-receiving surface can be reduced without generating a junction leakage, by using a silicon nitride film as an antireflection film, but by forming the $P^+$-type diffusion layer 16 in the surface region of the N-type epitaxial layer of the divided photodiode. However, since the junction capacitance between the $N^+$-type diffusion layer 13 and the P-type semiconductor substrate 11 and the junction capacitance between the $P^+$-type diffusion layer 16 and the N-type epitaxial layer 14 are large, the total junction capacitance of the divided photodiode becomes larger. Thus, the divided photodiode PD30 has a problem in that the level of the radio frequency noise to be generated by the signal processing in the circuit-integrating light-receiving element is adversely high.

SUMMARY OF THE INVENTION

The circuit-integrating light-receiving element of the present invention includes: a semiconductor substrate of a first conductivity type; a first semiconductor layer of a second conductivity type formed over the semiconductor substrate of the first conductivity type; a first semiconductor layer of the first conductivity type for dividing the first semiconductor layer of the second conductivity type into a plurality of semiconductor regions of the second conductivity type; a plurality of light-detecting sections for detecting signal light and outputting photoelectrically converted signals of the signal light being constituted by the respectively divided semiconductor regions of the second conductivity type and underlying regions of the semiconductor substrate of the first conductivity type, a divided photodiode being composed of the plurality of light-detecting sections, and a circuit component constituting a signal processor circuit for processing the photoelectrically converted signals being formed in a region of the first semiconductor layer of the second conductivity type electrically isolated from the region where the divided photodiode is formed; a second semiconductor layer of the second conductivity type formed only in the vicinity of the first semiconductor layer of the first conductivity type which functions as a division section of the divided photodiode and within the regions of the semiconductor substrate of the first conductivity type which form the respective light-detecting sections; and a second semiconductor layer of the first conductivity type formed in a surface region of the first semiconductor layer of the second conductivity type including a part of the first semiconductor layer of the first conductivity type functioning as the division section so as to cover an upper part of the second semiconductor layer of the second conductivity type.

In one embodiment, the second semiconductor layer of the first conductivity type is formed only in the vicinity of the division section, onto which the signal light is irradiated, over an area substantially equal to a beam diameter of the signal light, and the second semiconductor layer of the second conductivity type is formed such that a planar pattern of the second semiconductor layer of the second conductivity type does not outgrow a planar pattern of the second semiconductor layer of the first conductivity type.

In another embodiment, the second semiconductor layer of the second conductivity type is formed only in the vicinity of the division section onto which the signal light is irradiated so as to have a planar pattern satisfying a minimum size complying with a design rule of a fabrication process, and the second semiconductor layer of the first conductivity type is formed so as to cover an upper part of the second semiconductor layer of the second conductivity type.

The circuit-integrating light-receiving element according to another aspect of the present invention includes: a semiconductor substrate of a first conductivity type; a first semiconductor layer of a second conductivity type formed over the semiconductor substrate of the first conductivity type; a first semiconductor layer of the first conductivity type for dividing the first semiconductor layer of the second conductivity type into a plurality of semiconductor regions of the second conductivity type; a plurality of light-detecting sections for detecting signal light and outputting photoelectrically converted signals of the signal light being constituted by the respectively divided semiconductor regions of the second conductivity type and underlying regions of the semiconductor substrate of the first conductivity type, a divided photodiode being composed of the plurality of light-detecting sections, and a circuit component constituting a signal processor circuit for processing the photoelectrically converted signals being formed in a region of the first semiconductor layer of the second conductivity type electrically isolated from the region in which the divided photodiode is formed; and a second semiconductor layer of the second conductivity type which is formed in a part of the semiconductor regions of the second conductivity type constituting the light-detecting sections by diffusing an impurity from a surface of the semiconductor regions of the second conductivity type, and which has an impurity concentration higher than an impurity concentration of the first semiconductor layer of the second conductivity type.

In one embodiment, the second semiconductor layer of the second conductivity type is formed simultaneously with a base region of a vertical type PNP transistor functioning as the circuit component.

The circuit-integrating light-receiving element according to still another aspect of the present invention includes: a semiconductor substrate of a first conductivity type; a first semiconductor layer of a second conductivity type formed over the semiconductor substrate of the first conductivity type; a first semiconductor layer of the first conductivity type for dividing the first semiconductor layer of the second conductivity type into a plurality of semiconductor regions of the second conductivity type; a plurality of light-detecting sections for detecting signal light and outputting photoelectrically converted signals of the signal light being constituted by the respectively divided semiconductor regions of the second conductivity type and underlying regions of the semiconductor substrate of the first conductivity type, a divided photodiode being composed of the plurality of light-detecting sections, and a circuit component constituting a signal processor circuit for processing the photoelectrically converted signals being formed in a region of the first semiconductor layer of the second conductivity type electrically isolated from the region in which the divided photodiode is formed; and a second semiconductor layer of the first conductivity type formed in a surface region of the first semiconductor layer of the second conductivity type in a part of a division section constituted by the first semiconductor layer of the first conductivity type, onto which the signal light is irradiated, and in the vicinity of the division section so as to cover an area substantially equal to a beam diameter of the signal light.

Hereinafter, the functions or the effects to be attained by the present invention will be described.

According to one aspect of the present invention, the second semiconductor layer of the second conductivity type is formed only in the vicinity of the division section of the divided photodiode in the semiconductor substrate of the first conductivity type constituting the divided photodiode. Thus, the distance over which the optical carriers generated under the division section make a detour to diffuse around the division section to reach the P-N junction region can be shortened by the presence of the second semiconductor layer of the second conductivity type. Consequently, a decrease in response speed in the division section owing to the detour of the optical carriers around the division section can be suppressed.

Moreover, since the second semiconductor layer of the first conductivity type is formed in the surface region of the first semiconductor layer of the second conductivity type constituting the divided photodiode so as to cover the upper part of the second semiconductor layer of the second conductivity type, the optical carriers generated above the second semiconductor layer of the second conductivity type are absorbed into the second semiconductor layer of the first conductivity type. Thus, the optical carriers no longer make a detour around the second semiconductor layer of the second conductivity type to reach the P-N junction region. Consequently, a decrease in response speed can be prevented even when the second semiconductor layer of the second conductivity type is provided.

Furthermore, since the second semiconductor layer of the second conductivity type and the second semiconductor layer of the first conductivity type are formed only in the vicinity of the division section, the junction capacitance resulting from these layers in the divided photodiode can be reduced. Consequently, the level of radio frequency noise can be reduced in a circuit for processing a photoelectrically converted signal obtained by the divided photodiode.

In one embodiment of the present invention, the second semiconductor layer of the first conductivity type is formed only in the vicinity of the dividing section, onto which the signal light is irradiated, over a small area substantially equal to a beam diameter of the signal light, and the second semiconductor layer of the second conductivity type is formed such that a planar pattern of the second semiconductor layer of the second conductivity type does not outgrow a planar pattern of the second semiconductor layer of the first conductivity type. Consequently, the capacitance of the divided photodiode can be further reduced and the level of the radio frequency noise can be reduced by the decrement of the capacitance.

More specifically, in actuality, the signal light including an RF signal requiring higher response characteristics is not irradiated onto the entire division section of the divided photodiode. Thus, by forming the second semiconductor layer of the first conductivity type only in the vicinity of the dividing section, onto which the signal light is irradiated, over a narrow area corresponding to the beam diameter of the irradiated signal light, and by forming the second semiconductor layer of the second conductivity type only in the vicinity of the dividing section in the semiconductor substrate of the first conductivity type so as not to outgrow the second semiconductor layer of the first conductivity type, the capacitance of the divided photodiode can be reduced. Furthermore, in this case, the second semiconductor layer of the second conductivity type is located in the vicinity of the division section, onto which the signal light including an RF signal requiring higher response characteristics is actually irradiated. Thus, the response speed is not decreased because of the detour of the optical carriers around the division section.

In another embodiment of the present invention, the second semiconductor layer of the second conductivity type is formed only in the vicinity of the dividing section onto which the signal light is irradiated so as to have a planar pattern satisfying a minimum size complying with a design rule of a fabrication process, and the second semiconductor layer of the first conductivity type is formed so as to cover an upper part of the second semiconductor layer of the second conductivity type. Consequently, the junction area can be further reduced, so that the capacitance of the divided photodiode and the level of radio frequency noise can be further reduced.

In this case, since the region onto which the signal light is irradiated includes a region in which the second semiconductor layer of the second conductivity type in the vicinity of the division section and the second semiconductor layer of the first conductivity type covering the upper part thereof are not formed, the response speed is decreased to a certain degree because the optical carriers make a detour around the division section or the second semiconductor layer of the second conductivity type. However, in the case where it is critical to reduce the level of the radio frequency noise resulting from the junction capacitance in the divided photodiode, the junction capacitance reduction effect of this structure is significant, and thus this structure is very useful.

According to another aspect of the present invention, a semiconductor layer of the second conductivity type is formed by diffusing the impurity in a part of the semiconductor regions of the second conductivity type constituting the light-detecting sections of the divided photodiode over the semiconductor substrate of the first conductivity type so as to have an impurity concentration higher than an impurity concentration of the semiconductor regions of the second conductivity type. Thus, by utilizing the gradient of the impurity concentration of the semiconductor layer of the second conductivity type, the distance over which the optical carriers generated in the semiconductor regions of the second conductivity type move by diffusion to reach the P-N junction region can be shortened. Consequently, the response speed can be accelerated.

For example, in the case where the wavelength of a laser beam emitted by an employed semiconductor laser device is short, the decrease of the response speed owing to the detour of the optical carriers, which have been generated under the division section, around the division section becomes negligible because a smaller number of optical carriers are generated at a deep level as viewed from the light-receiving surface of the divided photodiode. Thus, in such a case, it is not necessary to form the second semiconductor layer of the first conductivity type and the second semiconductor layer of the second conductivity type. On the other hand, the optical carriers generated in the first semiconductor layer of the second conductivity type constituting the divided photodiode over the semiconductor substrate of the first conductivity type move by diffusion in the first semiconductor layer of the second conductivity type to reach the junction region between the first semiconductor layer of the second conductivity type and the semiconductor substrate of the first conductivity type. Accordingly, if the diffusion movement distance of the optical carriers generated in the first semiconductor layer of the second conductivity type is long, the response speed is reduced.

Thus, a third semiconductor layer of the second conductivity type having an impurity concentration higher than that of the first semiconductor layer of the second conductivity type is formed by diffusing an impurity from the surface of the first semiconductor layer of the second conductivity type constituting the divided photodiode over the semiconductor substrate of the first conductivity type and the potential caused by the concentration gradient of the third semiconductor layer of the second conductivity type is utilized, thereby shortening the diffusion movement distance of the optical carriers through the first semiconductor layer of the second conductivity type and improving the response speed.

In one embodiment of the present invention, the third semiconductor layer of the second conductivity type is formed simultaneously with a base region of a vertical type PNP transistor. Since the third semiconductor layer of the second conductivity type can be formed without increasing the number of process steps, the present invention is also advantageous in respect of costs.

According to still another aspect of the present invention, the second semiconductor layer of the first conductivity type is formed only in the vicinity of the division section of the divided photodiode, onto which the signal light is irradiated, in the surface region of the first semiconductor layer of the second conductivity type constituting the light-detecting sections so as to have an area substantially equal to the beam diameter of the signal light. Consequently, the response speed can be improved.

Specifically, in the case where the wavelength of a laser beam emitted by an employed semiconductor laser device is short, only the second semiconductor layer of the first conductivity type is formed over an area substantially equal to the beam diameter of the signal light in the semiconductor regions of the second conductivity type constituting the light-detecting sections of the divided photodiode, and the second semiconductor layer of the second conductivity type is not formed. In such a structure, though the capacitance of the divided photodiode is increased to a certain degree by the second semiconductor layer of the first conductivity type, the optical carriers generated in the first semiconductor layer of the second conductivity type constituting the light-detecting sections can be absorbed by the second semiconductor layer of the first conductivity type, and the delay of the response speed resulting from the diffusion movement distance of the optical carriers generated in the semiconductor regions of the second conductivity type constituting the light-detecting sections can be reduced.

In other words, when the second semiconductor layer of the first conductivity type is not formed, the optical carriers generated in the first semiconductor layer of the second conductivity type reach the junction region between the first semiconductor layer of the second conductivity type and the semiconductor substrate of the first conductivity type. However, since the optical carriers move by diffusion, the response speed becomes slower. On the other hand, if the second semiconductor layer of the first conductivity type is formed, the optical carriers generated in the first semiconductor layer of the second conductivity type reach the nearer junction region between the second semiconductor layer of the first conductivity type and the first semiconductor layer of the second conductivity type. Consequently, the diffusion movement distance of the carriers becomes shorter and the response speed can be improved.

Thus, the invention described herein makes possible the advantage of providing a circuit-integrating light-receiving element which can reduce the light reflectance on the light-receiving surface of a divided photodiode without increasing the junction leakage thereof, can increase the response speed of the divided photodiode and can reduce the level of radio frequency noise.

This and other advantages of the present invention will become apparent to those skilled in the art upon reading and understanding the following detailed description with reference to the accompanying figures.

BRIEF DESCRIPTION OF THE DRAWINGS

FIG. 1A is a plan view of the divided photodiode; and FIG. 1B is a view showing the cross-sectional structure thereof taken along the line 1a—1a in FIG. 1A.

FIG. 10A is a plan view showing a general configuration of the divided photodiode, and FIG. 10B is a view showing the cross-section thereof taken along the line 10b—10b of FIG. 10A.

DESCRIPTION OF THE PREFERRED EMBODIMENTS

First, the fundamental principle of the present invention will be described with reference to the drawings.

Figure 12:
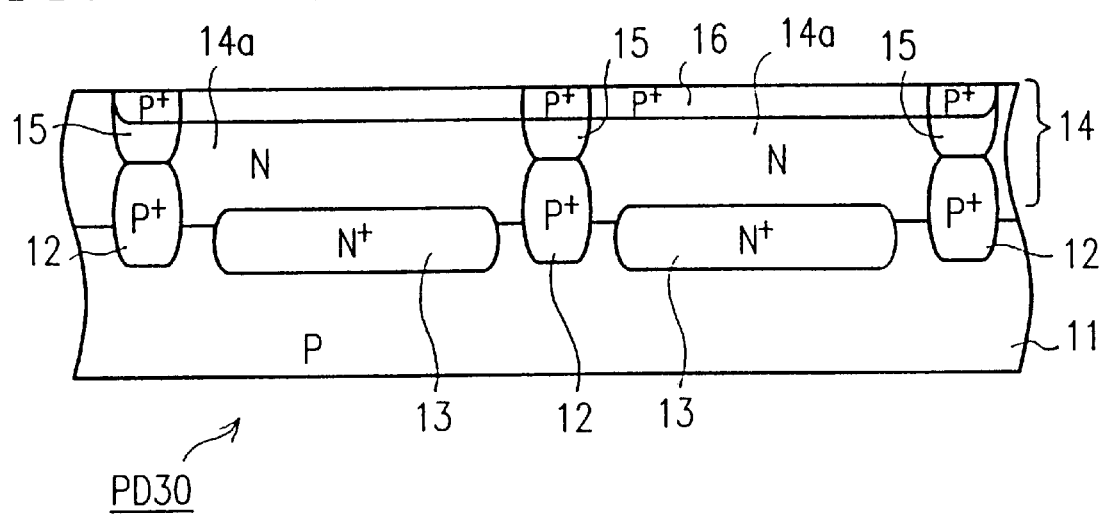
FIG. 12 is a view showing a cross-sectional structure of a conventional divided photodiode in which the response speed in the division section has been improved.
Figure 13A:
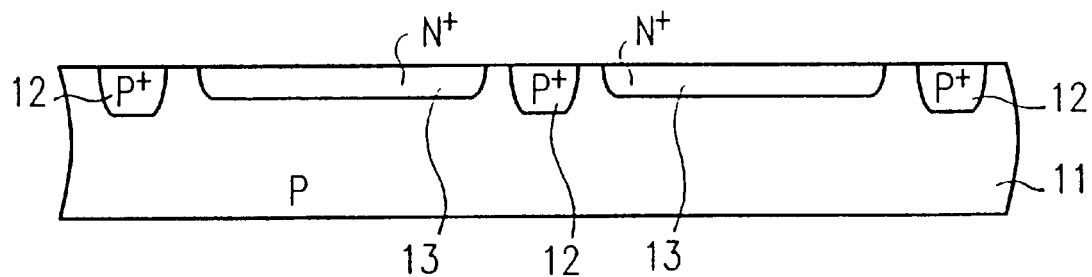
FIGS. 13A through 13C are cross-sectional views sequentially showing the main process steps for fabricating the divided photodiode shown in FIG. 12.
Figure 13B:
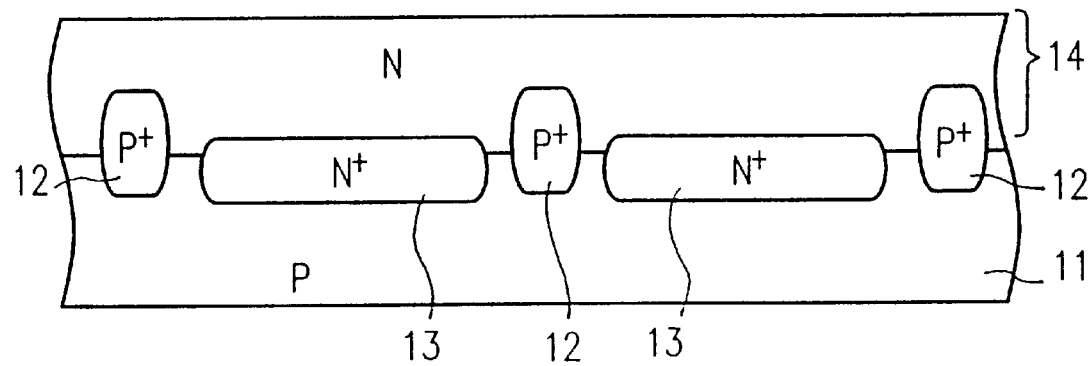
Figure 13C:
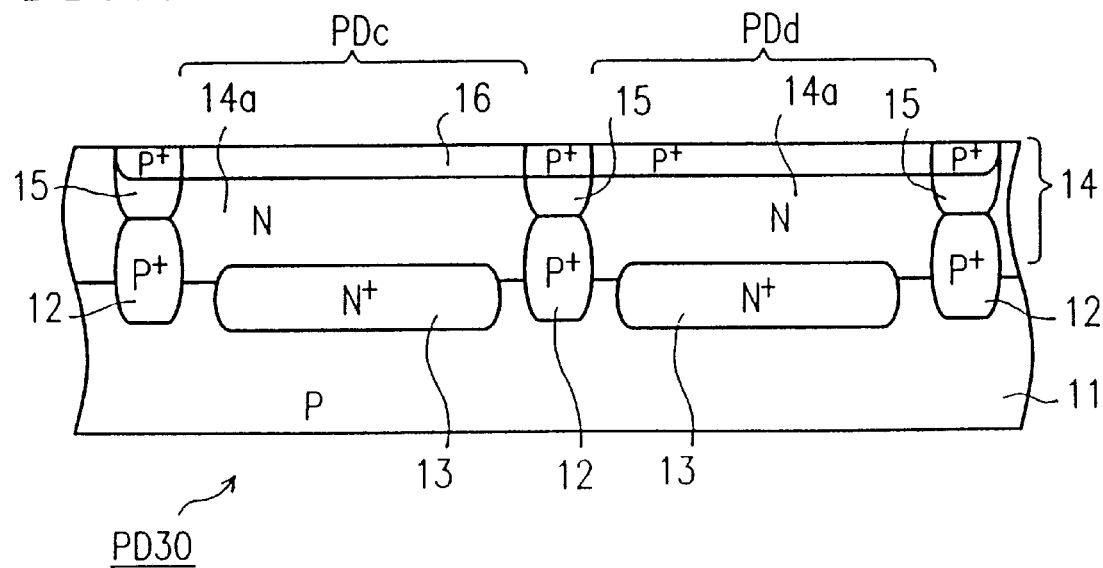

In order to solve the problems of reducing the capacitance of a divided photodiode and thereby reducing the level of radio frequency noise in a circuit-integrating light-receiving element including the divided photodiode, it is necessary to reduce the junction capacitance between the $N^+$-type diffusion layer 13 and the $P^+$-type silicon substrate 11 and the junction capacitance between the N-type epitaxial layer 14 and the $P^+$-type diffusion layer 16 by making the $N^+$-type diffusion layer 13 and the $P^+$-type diffusion layer 16 shown in FIG. 12 as small as possible.

On the other hand, in order not to decrease a response speed, it is necessary to form the $N^+$-type diffusion layer 13 in the vicinity of the division section of the divided photodiode. For example, in a square divided photodiode having sides of about 100 μm each, assuming that the specific resistance of the N-type epitaxial layer 14 is about 3 Ωcm and the specific resistance of the P-type silicon substrate is about 40 Ωcm, the junction capacitance between the N-type epitaxial layer 14 and the $P^+$-type diffusion layer 16 is about 0.63 pF (inverse bias of about 2.5 V) and the junction capacitance between the $N^+$-type diffusion layer 13 and the P-type silicon substrate 11 is about 0.25 pF (inverse bias of about 2.5 V). Thus, the junction capacitance can be effectively reduced if the junction capacitance between the N-type epitaxial layer 14 and the $P^+$-type diffusion layer 16 is eliminated, i.e., if the $P^+$-type diffusion layer 16 is not formed.

Figure 14A:
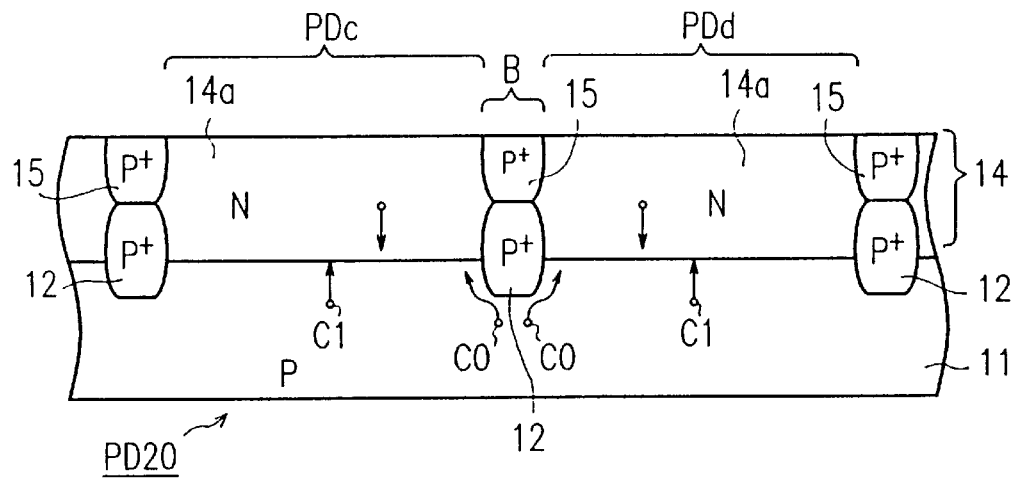
FIGS. 14A through 14C are cross-sectional views for illustrating the necessity of the N-type diffusion layer 13 and the P-type diffusion layer 16 of the divided photodiode shown in FIG. 12.
Figure 14B:
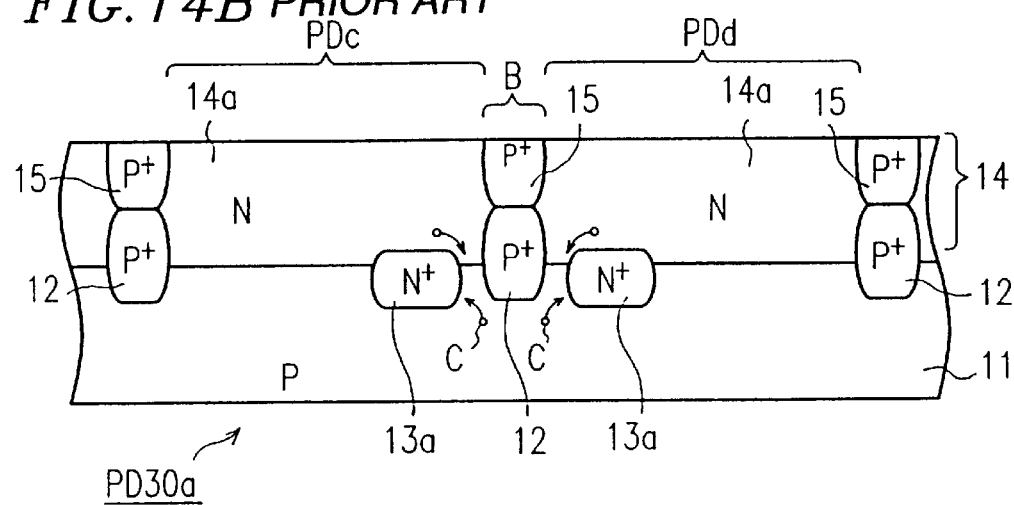

However, in the case where the $N^+$-type diffusion layer 13a is formed and the $P^+$-type diffusion layer 16 is not formed over the diffusion layer 13a, as in the divided photodiode PD30a shown in FIG. 14B, the optical carriers generated above the $N^+$-type diffusion layer 13a make a detour around the $N^+$-type diffusion layer 13a having a width in the range from about 50 μm to about 100 μm to move by diffusion toward the P-type silicon substrate 11. Thus, it was found that the response characteristics of the optical carriers generated above the $N^+$-type diffusion layer 13a were deteriorated because of the formation of the $N^+$-type diffusion layer 13a.

Figure 14C:
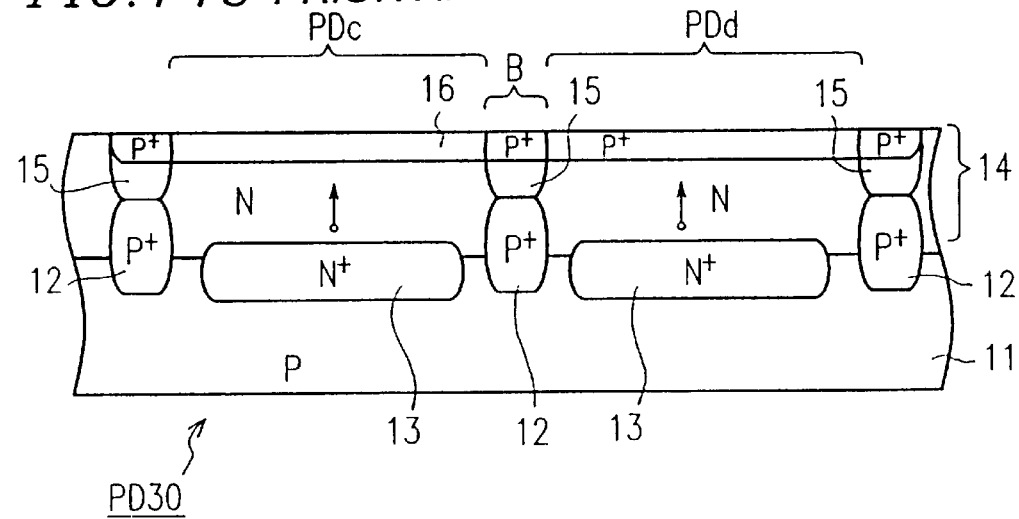
Figure 15:
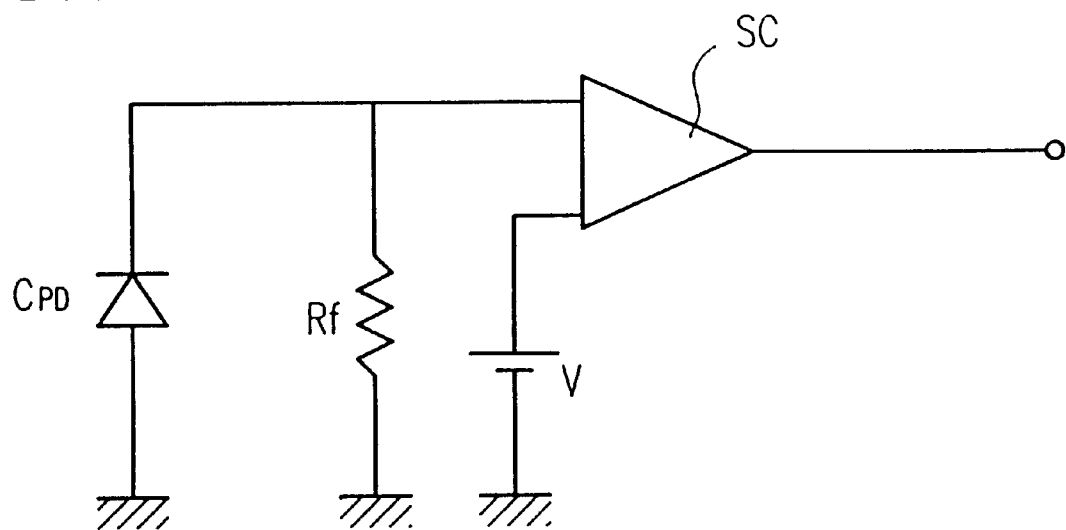
FIG. 15 is a circuit diagram showing an equivalent circuit of a conventional common circuit-integrating light-receiving element including the components involved with radio frequency noise.

On the other hand, as shown in FIG. 14C, it was also found that the $P^+$-type diffusion layer 16 formed over the $N^+$-type diffusion layer 13 absorbed the optical carriers generated in the N-type epitaxial layer 14 above the $N^+$-type diffusion layer 13 and thereby improved the response characteristics thereof. Thus, it was found that it is important to form the $P^+$-type diffusion layer 16 so as to cover the $N^+$-type diffusion layer 13, i.e., the $P^+$-type diffusion layer 16 cannot be eliminated.

Thus, it was found that it is important to minimize the region for forming the $N^+$-type diffusion layer 13 therein and to form the $P^+$-type diffusion layer 16 so as to cover the $N^+$-type diffusion layer 13 in order to decrease the size of the $P^+$-type diffusion layer 16 without decreasing the response speed.

Hereinafter, the embodiments of the present invention will be described, while taking into account the above-described viewpoint of the present invention.

EXAMPLE 1

Figure 1A:
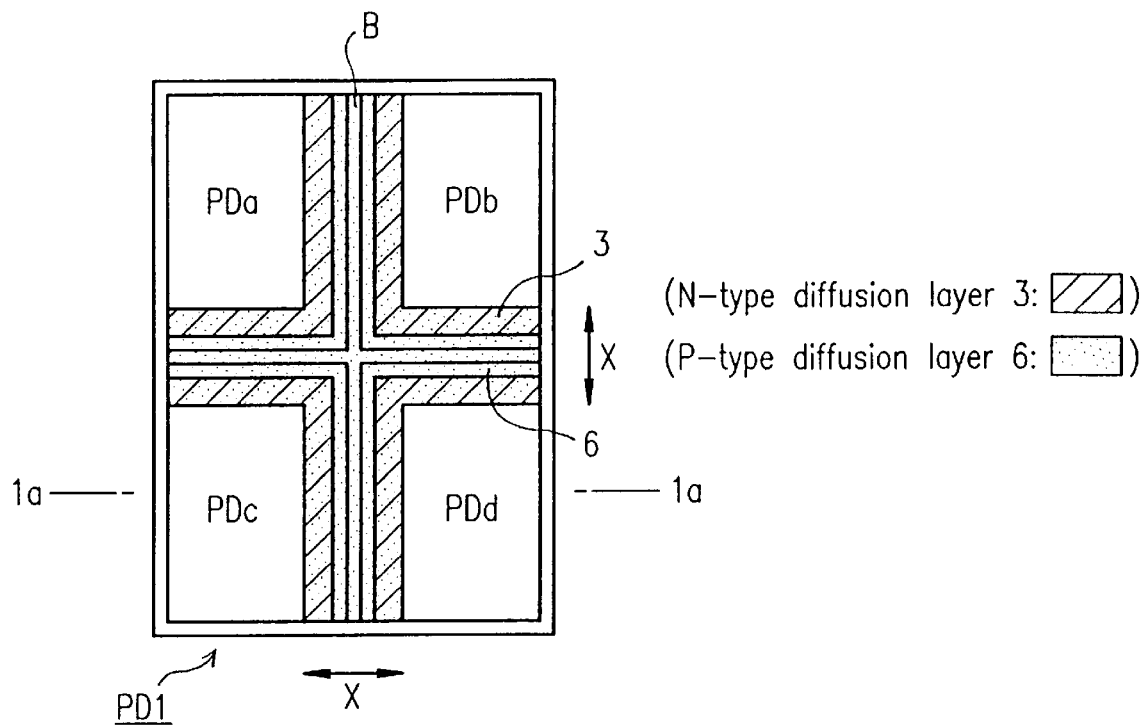
FIGS. 1A and 1B illustrate the structure of a divided photodiode incorporated into a circuit-integrating light-receiving element in a first example of the present invention.
Figure 1B:
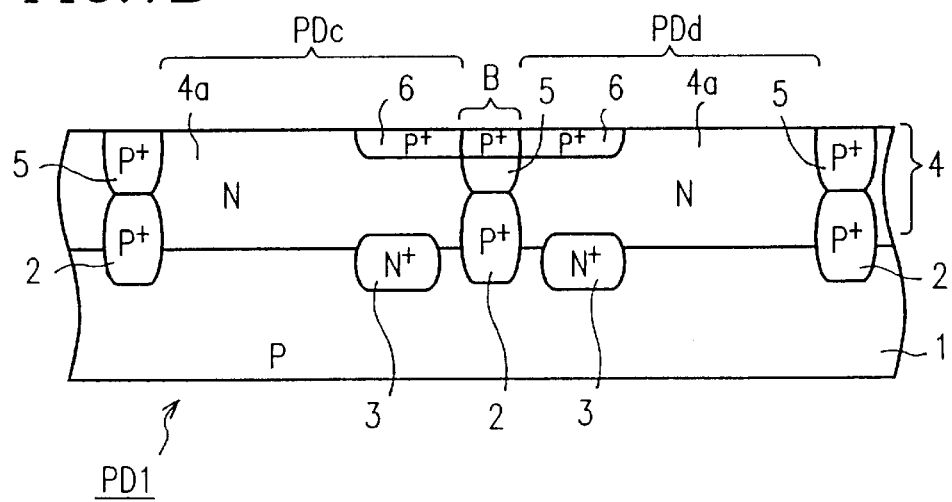
Figure 2:
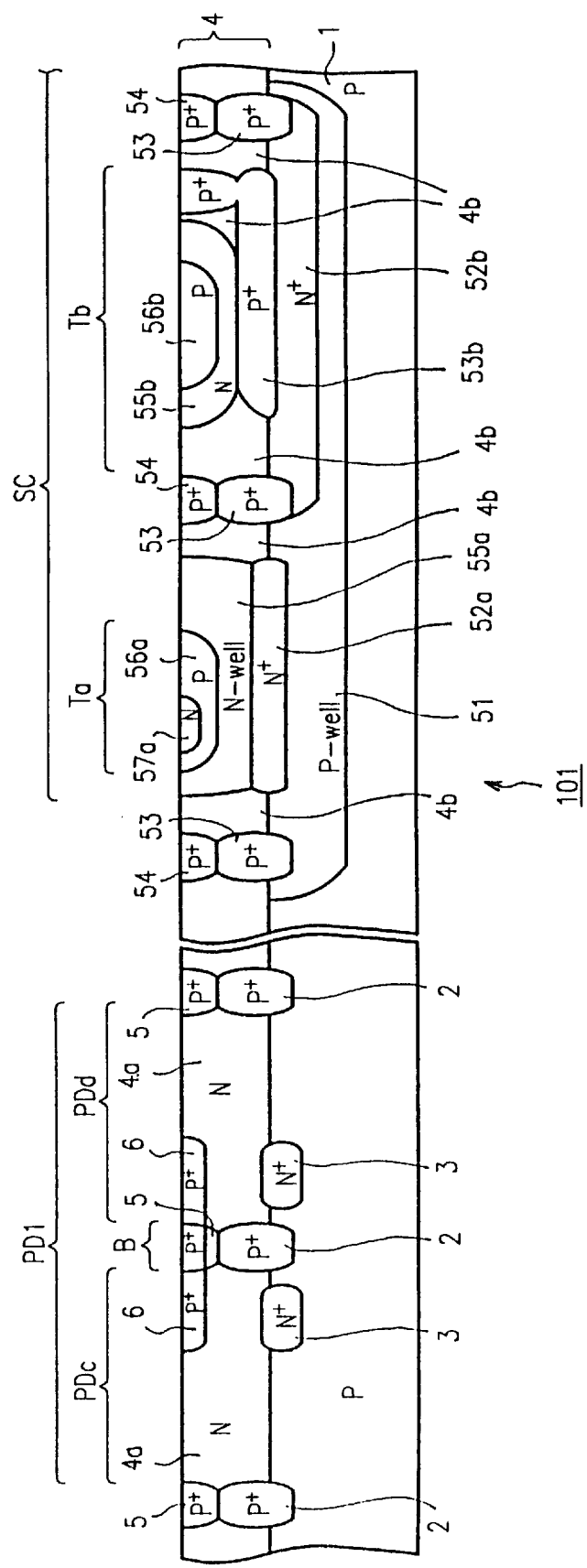
FIG. 2 is a cross-sectional view showing the structure of the circuit-integrating light-receiving element of the first example, showing the cross-sectional structure of the circuit components in a signal processor circuit integrated with the circuit-integrating light-receiving element, in addition to the cross-sectional structure of the divided photodiode.

FIGS. 1A and 1B illustrate the structure of a divided photodiode incorporated into a circuit-integrating light-receiving element in a first example of the present invention: FIG. 1A is a plan view of the divided photodiode; and FIG. 1B is a view showing the cross-sectional structure thereof taken along the line 1a—1a in FIG. 1A. FIG. 2 is a cross-sectional view showing the structure of the circuit-integrating light-receiving element of the first example, showing the cross-sectional structure of the circuit components of a signal processor circuit integrated with the circuit-integrating light-receiving element, in addition to the cross-sectional structure of the divided photodiode.

It is noted that a silicon oxide film or a silicon nitride film as an antireflection film and various components including multi-layer wires, a protective film and the like to be formed during the respective steps succeeding a metal processing step are omitted from these figures.

In these figures, PD1 is a quadruple divided photodiode incorporated into the circuit-integrating light-receiving element 101 of the present example, and an N-type epitaxial layer 4 is formed over a P-type silicon substrate 1 thereof. In the boundary region between the substrate 1 and the N-type epitaxial layer 4, a $P^+$-type buried diffusion layer 2 is selectively formed. In the surface region of the N-type epitaxial layer 4, a P$^+$-type isolating diffusion layer 5 is formed so as to reach the P$^+$-type buried diffusion layer 2. Moreover, the N-type epitaxial layer 4 is divided into a plurality of N-type epitaxial regions 4a by the P$^+$-type buried diffusion layer 2 and the P$^+$-type isolating diffusion layer 5 linked with the diffusion layer 2. Herein, light-detecting photodiode sections PDa, PDb, PDc and PDd for detecting signal light are constituted by the respectively divided N-type epitaxial regions 4a and the underlying regions of the substrate 1. And the quadruple divided photodiode PD1 is made up of these light-detecting photodiode sections PDa to PDd.

In addition, in the divided photodiode PD1, an N$^+$-type buried diffusion layer 3 is formed only in the vicinity of a division section B of the divided photodiode PD1 in the regions of the P-type silicon substrate 1 constituting the respective light-detecting sections PDa to PDd. Also, a P$^+$-type diffusion layer 6 is formed in the surface regions of the N-type epitaxial regions 4a including the P$^+$-type diffusion layer 5 functioning as the division section B so as to cover the upper part of the N$^+$-type buried diffusion layer 3 in the vicinity of the division section B.

Moreover, in the circuit-integrating light-receiving element 101, an NPN transistor Ta and a vertical type PNP transistor Tb, for example, are formed as circuit components constituting the signal processor circuits SC for processing a photoelectrically converted signal in the region of the N-type epitaxial layer 4 electrically isolated from the region where the divided photodiode PD1 is formed, as shown in FIG. 2. It is noted that a silicon oxide film, a silicon nitride film or the like is actually formed as an antireflection film on the surface of the N-type epitaxial layer 4 but such a film is not shown in these figures. In FIG. 1A, X denotes the width of the P$^+$-type diffusion layer 6 in the direction orthogonal to the longitudinal direction of the division section B.

Next, a method for fabricating the divided photodiode PD1 will be described.

Figure 3A:
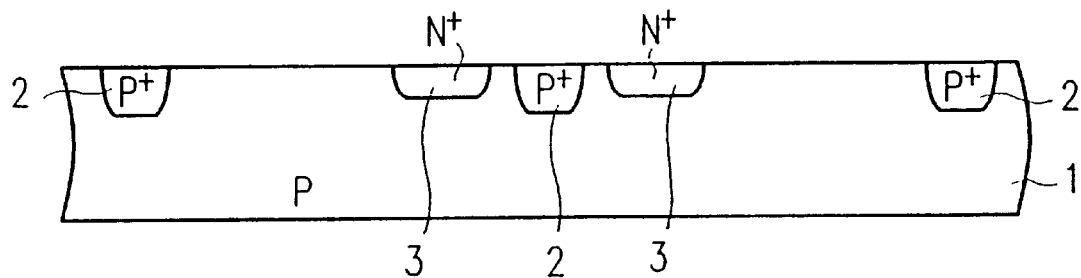
FIGS. 3A through 3C are cross-sectional views sequentially showing the main process steps for fabricating the divided photodiode in the circuit-integrating light-receiving element of the first example.
Figure 3B:
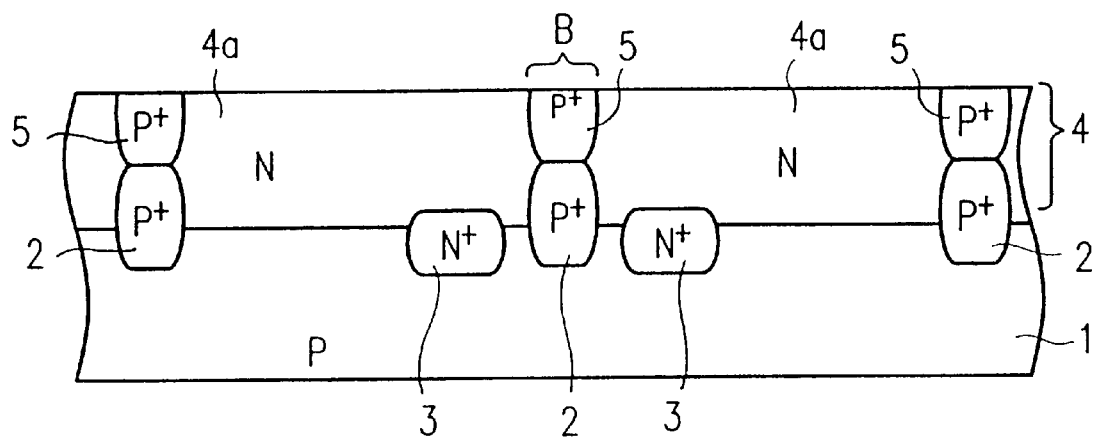
Figure 3C:
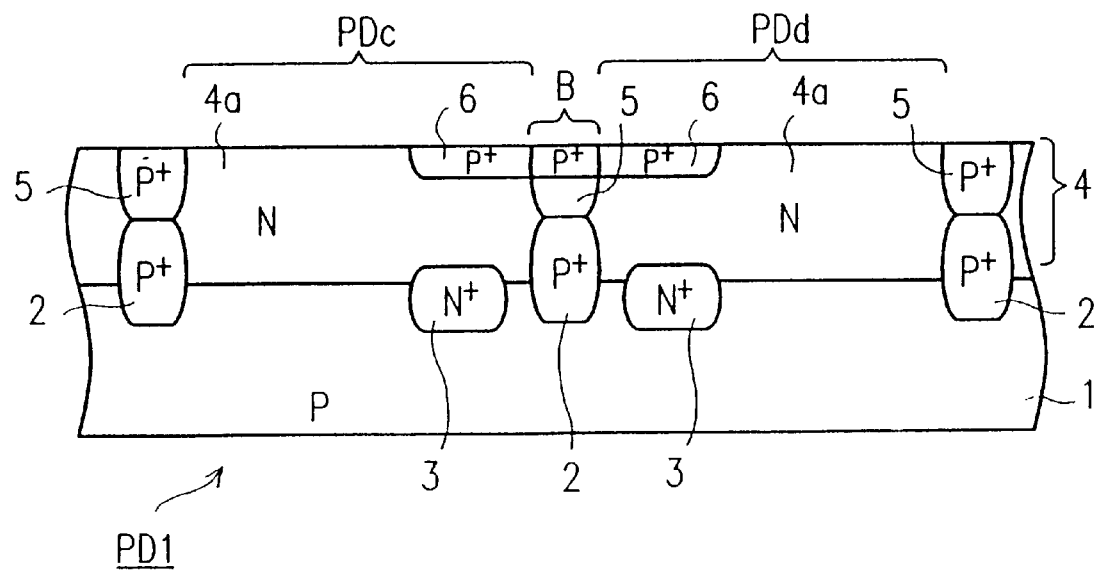

FIGS. 3A through 3C are cross-sectional views sequentially showing the main process steps for fabricating the divided photodiode section in the circuit-integrating light-receiving element 101.

First, as shown in FIG. 3A, a P$^+$-type buried diffusion layer 2 is formed in the regions for isolating the divided photodiode from other devices and in the region to be the division section of the divided photodiode in the surface region of the P-type silicon substrate 1, and an N$^+$-type buried diffusion layer 3 is formed only in the vicinity of the division section in the regions in the substrate 1 where the light-detecting sections are to be formed.

Next, as shown in FIG. 3B, an N-type epitaxial layer 4 is grown over the entire surface of the P-type silicon substrate 1 and an impurity is diffused from the surface of the N-type epitaxial layer 4, thereby forming a P$^+$-type diffusion layer 5 in the regions corresponding to the P$^+$-type buried diffusion layer 2 in the surface regions of the N-type epitaxial layer 4. The division section B of the divided photodiode is formed in this way.

Subsequently, as shown in FIG. 3C, a P$^+$-type diffusion layer 6 is formed in the region functioning as the division section B and in the vicinity thereof interposing the division section therebetween in the horizontal direction in the surface region of the N-type epitaxial layer 4 so as to cover the upper part of the N$^+$-type buried diffusion layer 3. The quadruple divided photodiode PD1 shown in FIGS. 1A and 1B is obtained in this way.

Furthermore, the circuit components (see FIG. 2) constituting the signal processor circuits SC of the light-receiving element 101 are formed over the P-type silicon substrate 1 by a common bipolar IC process.

Hereinafter, the process for fabricating the circuit components will be briefly described with reference to FIG. 2. Herein, an NPN transistor Ta and a vertical type PNP transistor Tb are illustrated as exemplary circuit components.

First, a P-well 51 for isolating the respective devices is formed in the P-type silicon substrate 1. Subsequently, an N$^+$-type buried diffusion layer 52a having a high concentration is formed on the surface of the P-well 51 for reducing the collector resistance of the NPN transistor Ta. In addition, an N$^+$-type buried diffusion layer 52b is formed in the region where the vertical type PNP transistor Tb is to be formed. Furthermore, a P$^+$-type buried diffusion layer 53 having a high concentration for isolating the respective devices is formed on the surface of the substrate 1 and a P$^+$-type buried diffusion layer 53b having a high concentration is simultaneously formed for reducing the collector resistance of the PNP transistor Tb.

Thereafter, an N-type epitaxial layer 4 is formed, an N-well 55a for reducing the collector resistance of the NPN transistor Ta and an N-type base diffusion layer 55b for the PNP transistor Tb are formed, and a P$^+$-type isolating diffusion layer 54 having a high concentration for isolating the respective devices is formed.

Furthermore, a P-type base diffusion layer 56a for the NPN transistor Ta is formed over the N-well 55a, and a P-type emitter diffusion layer 56b is simultaneously formed on the surface of the N-type base diffusion layer 55b of the PNP transistor.

Finally, an emitter diffusion layer 57a is formed in the surface region of the P-type base diffusion layer 56a of the NPN transistor Ta, thereby obtaining the circuit components constituting the signal processor circuits SC. Herein, the N-type epitaxial layer 4, the P$^+$-type buried diffusion layer 53 and the P$^+$-type isolating diffusion layer 54 are formed by the same process steps for forming the N-type epitaxial layer 4, the P$^+$-type buried diffusion layer 2 and the P$^+$-type isolating diffusion layer 3 in the region where the divided photodiode is to be formed.

In the circuit-integrating light-receiving element 101 of the first example having such a configuration, the areas of the N$^+$-type diffusion layer 3 and the P$^+$-type diffusion layer 6 in the divided photodiode PD1 are smaller than those of the conventional divided photodiode structure shown in FIG. 12, so that the capacitance of the divided photodiode has been reduced. Consequently, the level of radio frequency noise in the photoelectrically converted signal obtained by the divided photodiode can be reduced.

In addition, since the N$^+$-type diffusion layer 3 is located in the vicinity of the division section constituted by the P$^+$-type diffusion layer, the conditions for preventing the response speed from being decreased in the division section are satisfied. In other words, the structure of the division section onto which signal light is irradiated for reading out an RF signal requiring higher response characteristics is substantially equivalent to that shown in FIG. 12. Thus, the response speed of the divided photodiode PD1 does not become inferior to that of the divided photodiode having a conventional structure shown in FIG. 12.

In this way, a structure for reducing the level of radio frequency noise can be obtained without deteriorating the response characteristics of a divided photodiode as compared with those of a conventional divided photodiode.

EXAMPLE 2

Figure 4:
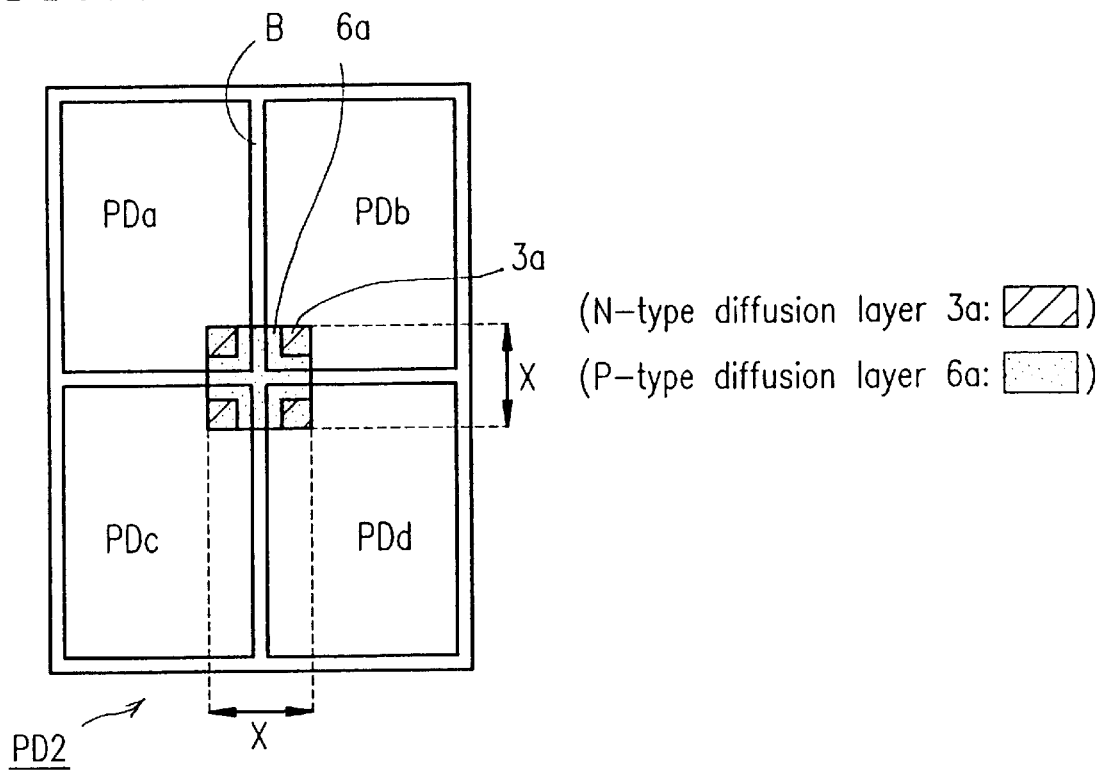
FIG. 4 is a plan view illustrating a circuit-integrating light-receiving element in a second and a third example of the present invention, showing a divided photodiode incorporated into the circuit-integrating light-receiving element.

FIG. 4 is a plan view for illustrating a circuit-integrating light-receiving element in a second example of the present invention, showing a divided photodiode incorporated into the circuit-integrating light-receiving element.

In this figure, PD2 is a divided photodiode incorporated into the circuit-integrating light-receiving element of the second example. In this divided photodiode PD2, the $N^+$-type diffusion layer 3 (see FIG. 1A) formed all over the division section B and the vicinity thereof and the $P^+$-type diffusion layer 6 (see FIG. 1A) formed over the $N^+$-type diffusion layer 3 so as to cover the upper part of the $N^+$-type diffusion layer 3 in the divided photodiode PD1 of the first example, are replaced by an $N^+$-type diffusion layer 3a and a $P^+$-type diffusion layer 6a having smaller areas, respectively.

More specifically, the divided photodiode PD2 of the second example includes: a $P^+$-type diffusion layer 6a formed only within an area irradiated with signal light for reading out an RF signal after focusing has been performed, e.g., an area onto which signal light having a beam diameter of about 50 $\mu$m$\phi$ is irradiated; and an $N^+$-type diffusion layer 3a formed in the vicinity of the division section B in the P-type silicon substrate 1 such that the planar pattern thereof does not outgrow the planar pattern of the $P^+$-type diffusion layer 6a. The remaining configuration of the divided photodiode PD2 is the same as that of the divided photodiode PD1 of the first example.

Next, the functions or the effects to be attained by the divided photodiode PD2 will be described.

One of the objectives of the present invention is to provide a structure for reducing the level of radio frequency noise by reducing the capacitance of a divided photodiode without deteriorating the response characteristics of the divided photodiode as compared with those of a conventional divided photodiode PD30 shown in FIG. 12.

The present inventors analyzed the effects to be attained by providing the $N^+$-type diffusion layer 13 and the $P^+$-type diffusion layer 16 which are characteristic of the structure of the divided photodiode PD30 shown in FIG. 12. As a result, it was found that it is important to form the $N^+$-type diffusion layer 13 in the vicinity of the division section of the divided photodiode and that it is also important to form the $P^+$-type diffusion layer 16 so as to cover the upper part of the $N^+$-type diffusion layer 13.

Taking into account this fact, the $N^+$-type diffusion layer 3 is formed only in the vicinity of the division section and the $P^+$-type diffusion layer 6 is formed so as to cover the upper part of the $N^+$-type diffusion layer 3 in the first example. On the other hand, in this second example, by performing this analysis more precisely and by forming a smaller $N^+$-type diffusion layer 3a and a smaller $P^+$-type diffusion layer 6a without deteriorating the response characteristics, the capacitance of the divided photodiode and the level of radio frequency noise are reduced.

First, regarding the $N^+$-type diffusion layer 3, it is necessary to form the layer 3 in the vicinity of the division section B. In addition, in the region where the $N^+$-type diffusion layer 3 is formed, the level of the junction between the $N^+$-type diffusion layer 3 and the P-type silicon substrate 1 becomes deeper as compared with the regions where the $N^+$-type diffusion layer 3 is not formed. In this case, the optical carriers generated under the $N^+$-type diffusion layer 3 move by diffusion toward the junction region between the $N^+$-type diffusion layer 3 and the P-type silicon substrate 1.

Since the junction level becomes deeper, the diffusion-movement distance becomes shorter. Thus, it was found that the response characteristics are improved in the regions other than the division section.

That is to say, the effects contributing to the improvement of the response speed which are obtained by forming the $N^+$-type diffusion layer 3 include an effect that the diffusion-movement distance of the optical carriers, which are generated under the division section and make a detour to diffuse around the division section, can be shortened, and an effect that the diffusion-movement distance of the optical carriers, which are generated in the regions other than the region under the division section, can also be shortened because of a deeper junction level between the $N^+$-type diffusion layer and the P-type silicon substrate. However, as compared with the former effect, the latter effect less influences the response speed.

Based on the above-described analysis, required minimum sizes of the $N^+$-type diffusion layer 3 and the $P^+$-type diffusion layer 6 were examined in order to make the $N^+$-type diffusion layer 3 and the $P^+$-type diffusion layer 6 as small as possible without decreasing the response speed.

Figure 11A:
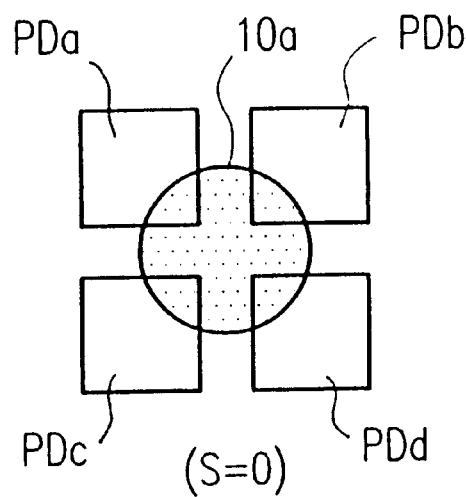
FIGS. 11A through 11C are diagrams illustrating the respective appearances of the light beam spots in an astigmatism method.
Figure 11B:
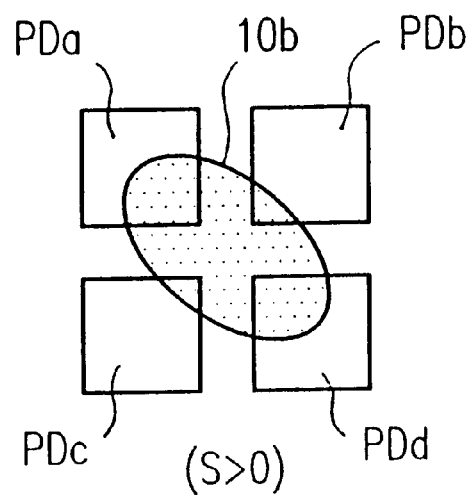
Figure 11C:
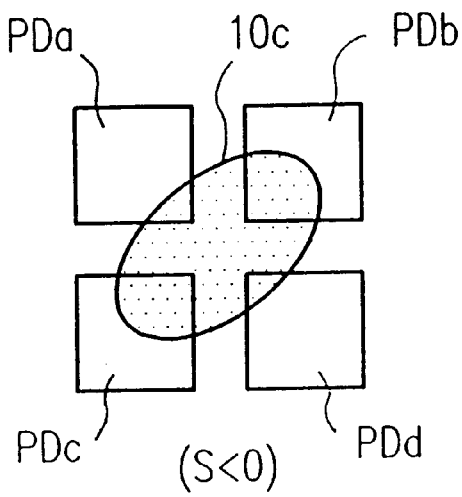

More specifically, in a divided photodiode used for an optical pickup, first, signal-detecting light must be in focus with respect to a disk. In the states where the signal-detecting light is out of focus as shown in FIGS. 11B and 11C, the signal-detecting light beam reflected by the disk also impinges against the positions distant from the division section of the divided photodiode. Thus, the divided photodiode is required to have a certain degree of size. The response speed of a focusing signal for detecting such a state may be slow.

Conversely, the portion of a divided photodiode where the response speed is required to be high is only the portion onto which signal light is irradiated in a state where the signal-detecting light is in focus on the disk and an RF signal can be read out. As can be seen from FIG. 11A, the signal light is incident onto only a very small area of the divided photodiode. That is to say, in order not to decrease the response speed at the time of reading an RF signal at all, the following three effects are required to be attained by the $N^+$-type diffusion layer 3 and the $P^+$-type diffusion layer 6 in the area onto which the signal light is irradiated.

The first effect is an effect that the diffusion-movement distance of the optical carriers, which are generated under the division section and make a detour to diffuse around the division section, is shortened by the $N^+$-type diffusion layer 3. The second effect is an effect that the diffusion-movement distance of the optical carriers, which are generated in the regions other than the region under the division section, is shortened because of a deeper junction level between the $N^+$-type diffusion layer 3 and the P-type silicon substrate 1. The third effect is an effect that the optical carriers generated in the N-type epitaxial layer 4 are absorbed by the $P^+$-type diffusion layer 6 formed so as to cover the upper part of the $N^+$-type diffusion layer 3.

Thus, the $N^+$-type diffusion layer 3 need to be formed all over the area of the divided photodiode onto which the signal light is irradiated at the time of reading an RF signal and which requires high-speed response characteristics, and the $P^+$-type diffusion layer 6 needs to be formed so as to cover the upper part of the $N^+$-type diffusion layer 3.

From such a point of view, in this second example, the $N^+$-type diffusion layer 3a and the $P^+$-type diffusion layer 6a are formed only under the area of the divided photodiode onto which the signal light is irradiated at the time of reading an RF signal and which requires a high-speed operation. Thus, as compared with the first example, the junction areas of both the N+-type diffusion layer 3a and the P+-type diffusion layer 6a can be reduced and the junction capacitances thereof can also be reduced. As a result, the level of radio frequency noise can be further reduced advantageously.

In addition, since the above-described first to third effects can be attained by the N+-type diffusion layer 3a and the P+-type diffusion layer 6a in the area of the divided photodiode onto which the signal light is irradiated at the time of reading an RF signal, it is possible to prevent the response speed from being decreased.

EXAMPLE 3

Next, a divided photodiode of a circuit-integrating light-receiving element in a third example of the present invention will be described.

In the divided photodiode of the third example, the N+-type diffusion layer 3a (i.e., the second semiconductor layer of the second conductivity type) of the second example is formed only in the vicinity of the division section irradiated with the signal light so as to have a minimum size pattern complying with the design rule of a fabrication process, and the P+-type diffusion layer 6a (i.e., the second semiconductor layer of the first conductivity type) is formed so as to cover the upper part of the N+-type diffusion layer 3a. The remaining configuration of the divided photodiode of the third example is the same as that of the divided photodiode of the first or the second example.

Next, the functions or the effects to be attained by the divided photodiode of the third example will be described.

Among the effects on the response speed which are obtained by forming the N+-type diffusion layer 3a, the effect that the diffusion-movement distance of the optical carriers, which are generated in the regions other than the region under the division section, is shortened because of a deeper junction level between the N+-type diffusion layer and the P-type silicon substrate, less contributes to the increase of the response speed, as compared with the effect that the diffusion-movement distance of the optical carriers, which are generated under the division section and make a detour to diffuse around the division section, is shortened. Thus, it is a matter of choice which of the two effects (i.e., the former effect about the response speed and the effect of reducing the level of radio frequency noise to be attained by further reducing the sizes of the N+-type diffusion layer 3a and the P+-type diffusion layer 6a) is given a priority.

More specifically, if the N+-type diffusion layer 3a is formed in a smaller size than that of the N+-type diffusion layer 3a of the second example, the P-N junction level in the P-type silicon substrate 1 does not become deep and the diffusion-movement distance of the optical carriers generated in the regions other than the region under the division section does not become shorter, in the area onto which the signal light is irradiated and where the N+-type diffusion layer 3a does not exist. As a result, the response speed is decreased in such an area. However, in this case, the area of the N+-type diffusion layer 3a can be further reduced and the area of the P+-type diffusion layer 6a formed so as to correspond to the N+-type diffusion layer 3a can also be further reduced. As a result, the capacitance of the divided photodiode can be reduced and the level of radio frequency noise can be further reduced advantageously.

Thus, the structure of the third example has a disadvantage in that the response speed is decreased to a certain degree as compared with the structure shown in FIG. 12, but is rather suitable for a case where the reduction in level of radio frequency noise is critical.

More specifically, in the third example, the N+-type diffusion layer 3a is formed only in the division section onto which the signal light is irradiated at the time of reading out an RF signal requiring a high response speed, and in the vicinity thereof so as to have a minimum size complying with a design rule of a fabrication process, and the P+-type diffusion layer 6a is formed so as to cover the upper part of the N+-type diffusion layer 3a thus formed. In this structure, since the sizes of the N+-type diffusion layer 3a and the P+-type diffusion layer 6a have been minimized, the capacitance of the divided photodiode is also minimized and the level of the radio frequency noise can be considerably reduced. However, on the other hand, since the area of the divided photodiode onto which the signal light is irradiated at the time of reading an RF signal and in which high-speed response characteristics are required is smaller than the beam diameter of the signal light, there are regions where the N+-type diffusion layer 3a is not formed within the area irradiated with the signal light except for the division section. In these regions, since the P-N junction is located at a shallower level and the diffusion-movement distance of the optical carriers generated in the P-type silicon substrate 1 becomes rather long, the response speed is decreased to a certain degree. Nevertheless, a sufficiently higher response speed can be secured as compared with the divided photodiode PD20 having a conventional structure such as that shown in FIGS. 10A and 10B.

EXAMPLE 4

Figure 5:
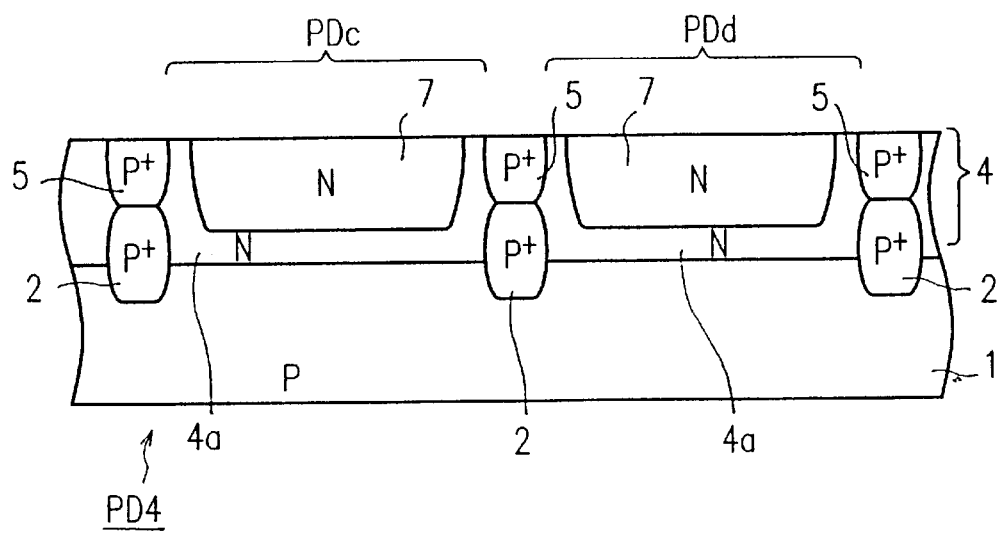
FIG. 5 is a view showing a cross-sectional structure of a divided photodiode in a circuit-integrating light-receiving element in a fourth example of the present invention.

FIG. 5 is a cross-sectional view of a divided photodiode incorporated into a circuit-integrating light-receiving element in a fourth example of the present invention, showing a part corresponding to the cross-sectional part of the divided photodiode shown in FIG. 1B. It is noted that an oxide film or a nitride film and various components including multi-layer wires, a protective film and the like to be formed during the respective steps succeeding a metal processing step are omitted from FIG. 5.

In this figure, PD4 is a quadruple divided photodiode incorporated into the circuit-integrating light-receiving element of the fourth example, and an N-type epitaxial layer 4 is formed over a P-type silicon substrate 1 thereof. In the boundary region between the substrate 1 and the N-type epitaxial layer 4, a P+-type buried diffusion layer 2 is selectively formed. In the surface region of the N-type epitaxial layer 4, a P+-type isolating diffusion layer 5 is formed so as to reach the P+-type buried diffusion layer 2. Moreover, the N-type epitaxial layer 4 is divided into a plurality of N-type epitaxial regions 4a by the P+-type buried diffusion layer 2 and the P+-type isolating diffusion layer 5 linked with the diffusion layer 2. Herein, light-detecting photodiode sections PDa, PDb, PDc and PDd for detecting signal light are formed by the respectively divided N-type epitaxial regions 4a and the underlying regions of the substrate 1. Though not shown in FIG. 5, the light-detecting photodiode sections PDa and PDb shown in FIGS. 1A and 4 are also formed on the substrate 1. The quadruple divided photodiode PD4 is made up of these light-detecting photodiode sections PDa to PDd.

In addition, in the divided photodiode PD4, an N-type diffusion layer 7 having a higher concentration than that of the N-type epitaxial regions 4a is formed by diffusing an impurity from the surface of the N-type epitaxial layer 4 in the N-type epitaxial regions 4a constituting the respective light-detecting sections PDa to PDd.

Next, a method for fabricating the divided photodiode PD4 will be described.

Figure 6A:
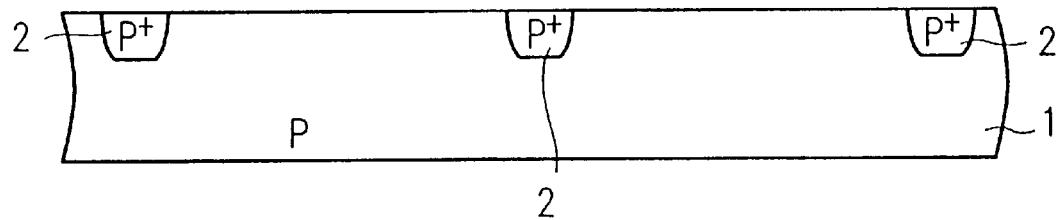
FIGS. 6A through 6C are cross-sectional views sequentially showing the main process steps for fabricating the divided photodiode of the fourth example.
Figure 6B:
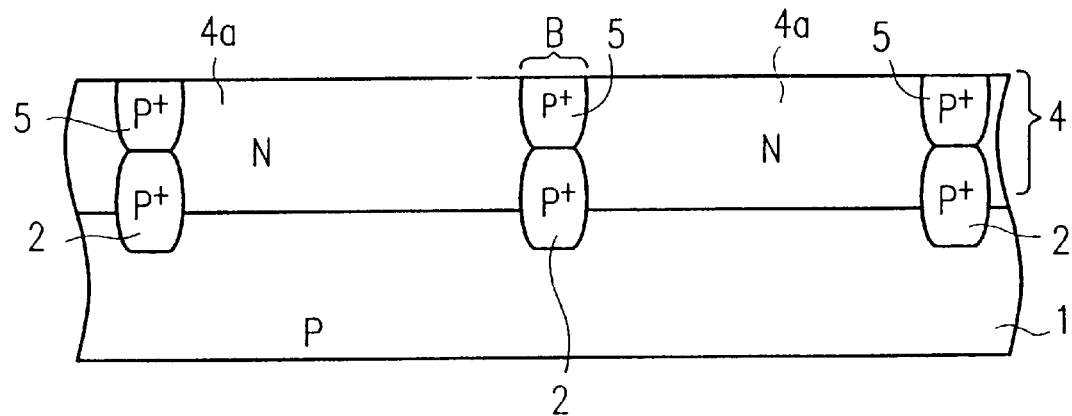

First, as shown in FIG. 6A, the P$^+$-type buried diffusion layer 2 is formed in the regions for isolating the light-detecting photodiode sections from other devices and in the region to be the division section B of the divided photodiode in the surface region of the P-type silicon substrate 1. Subsequently, as shown in FIG. 6B, the N-type epitaxial layer 4 is grown over the entire surface of the P-type silicon substrate 1 and an impurity is diffused from the surface of the N-type epitaxial layer 4, thereby forming the P$^+$-type diffusion layer 5 in the regions corresponding to the P$^+$-type buried diffusion layer 2 in the surface regions of the N-type epitaxial layer 4. The division section B of the divided photodiode is formed in this way.

Figure 6C:
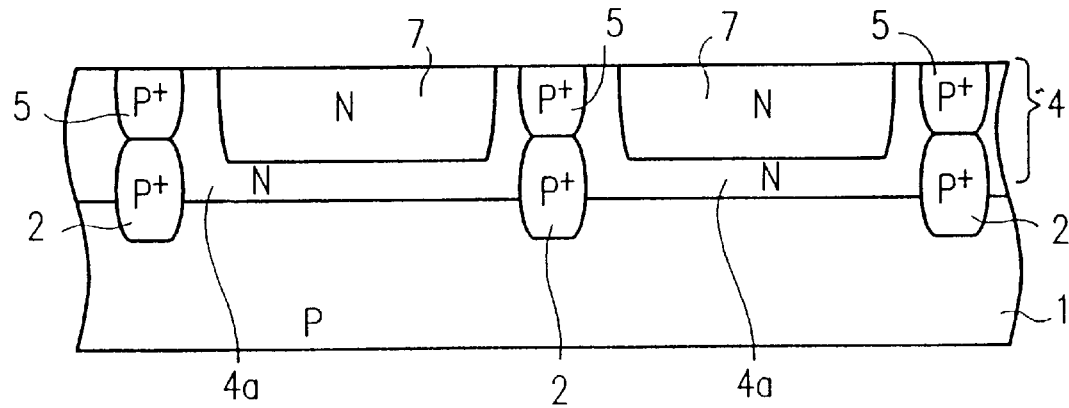

Next, as shown in FIG. 6C, an impurity is diffused from the surface of the N-type epitaxial regions 4a functioning as the respectively divided light-detecting photodiode sections, thereby forming the N-type diffusion layer 7 having a higher concentration than that in the N-type epitaxial regions 4a.

The divided photodiode PD4 having the structure shown in FIG. 5 is obtained in this way. Furthermore, the signal processor circuit (not shown) of the circuit-integrating light-receiving element of this example is formed over the P-type silicon substrate 1 by a common bipolar IC process as described in the first example.

Next, the functions or the effects to be attained in the present example will be described.

For example, in an optical pickup for a DVD (digital video disk), the wavelength of a laser beam emitted by a semiconductor laser device used as a light-emitting element becomes shorter than the wavelength of a laser beam emitted by a semiconductor laser device used as a light-emitting element for a conventional optical pickup for CD-ROM. Specifically, the wavelength of a laser beam emitted by a semiconductor laser device for an optical pickup for CD-ROM is about 780 nm, while the wavelength of a laser beam emitted by a semiconductor laser device for an optical pickup for DVD is about 650 nm.

This means that the penetration depth of signal light incident onto a circuit-integrating light-receiving element (i.e., how far the signal light penetrates through the circuit-integrating light-receiving element) becomes shallower in an optical pickup for DVD, and also means that when a semiconductor laser beam for reading out an RF signal is irradiated onto the divided photodiode, fewer optical carriers are generated from a deep level. In such a case, even when the N$^+$-type diffusion layer 3 of the divided photodiode PD1 of the first example is not formed, the response is less likely to be delayed because of the detour of the optical carriers around the division section B. Thus, in an optical pickup in which the wavelength of signal light irradiated onto the divided photodiode is short, it is not necessary to form the N$^+$-type diffusion layer 3 in the vicinity of the division section of the divided photodiode, and it is not necessary to form the P$^+$-type diffusion layer 6 covering the N$^+$-type diffusion layer 3, either.

Figure 10A:
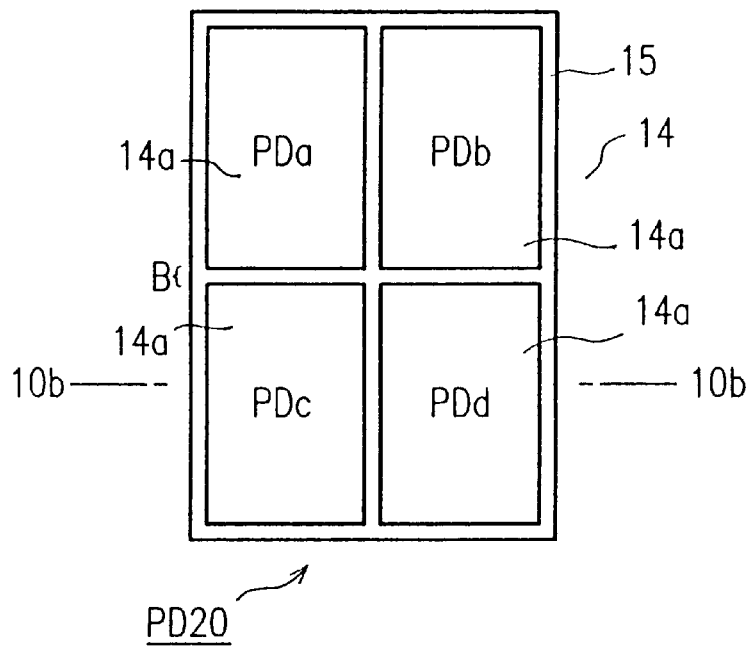
FIGS. 10A and 10B illustrate a conventional quadruple divided photodiode.
Figure 10B:
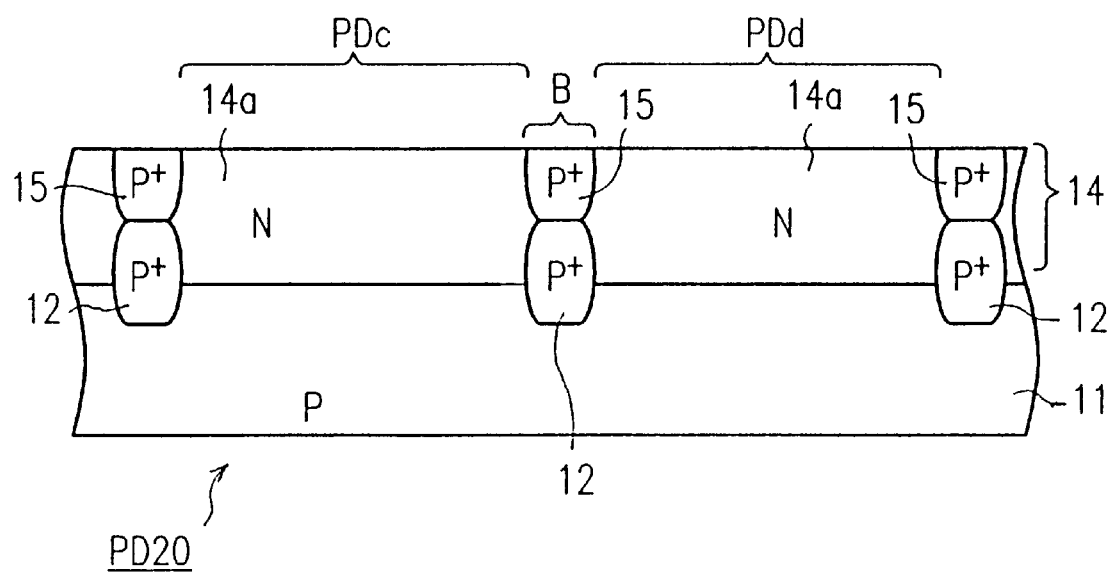

The elimination of the N$^+$-type diffusion layer 3 and the P$^+$-type diffusion layer 6 from the divided photodiode of the first example results in the same structure as that of the conventional divided photodiode PD20 shown in FIGS. 10A and 10B. In such a structure, since the junction capacitance is small, there is no problem about the level of radio frequency noise. However, when the wavelength of signal light is short, a larger number of optical carriers are generated in the N-type epitaxial layer 4 and a larger number of optical carrier components move by diffusion through the N-type epitaxial layer 4, so that a sufficient response speed cannot be obtained.

Thus, in this fourth example, an N-type diffusion layer 7 having a higher concentration than that of the N-type epitaxial regions 4a is formed by diffusing an impurity in the N-type epitaxial regions 4a as shown in FIG. 6C, and the optical carriers generated in the N-type epitaxial regions 4a are accelerated by the internal electric field of the layer 7, thereby realizing a higher response speed.

Moreover, even if the N-type diffusion layer 7 is additionally formed, a new P-N junction is not generated and therefore the junction capacitance is not varied. Thus, in the fourth example, the junction capacitance of the divided photodiode is smaller and the level of radio frequency noise is lower, as compared with any structure of the first or the third example.

Optionally, the N-type diffusion layer 7 may be formed during the same process step for forming the base region 55b (see FIG. 2) of the vertical type PNP transistor formed in the signal processor circuit section. In such a case, the location of the N-type diffusion layer 7 becomes rather deep, but it is not necessary to increase the number of process steps.

Figure 7A:
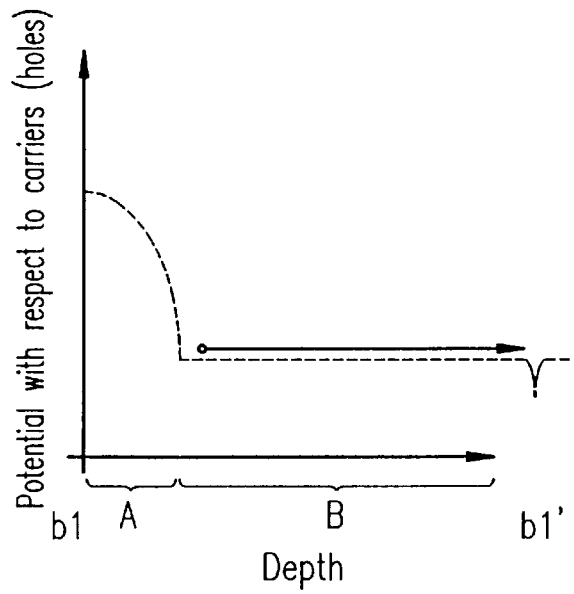
FIGS. 7A and 7B are diagrams respectively illustrating a potential distribution and a structure when the N-type diffusion layer 7 is formed at a shallow level in the divided photodiode of the fourth example.
Figure 7B:
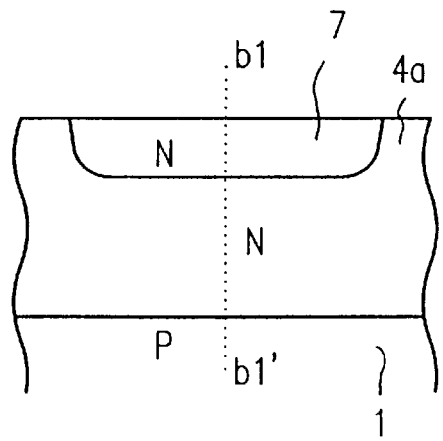
Figure 8A:
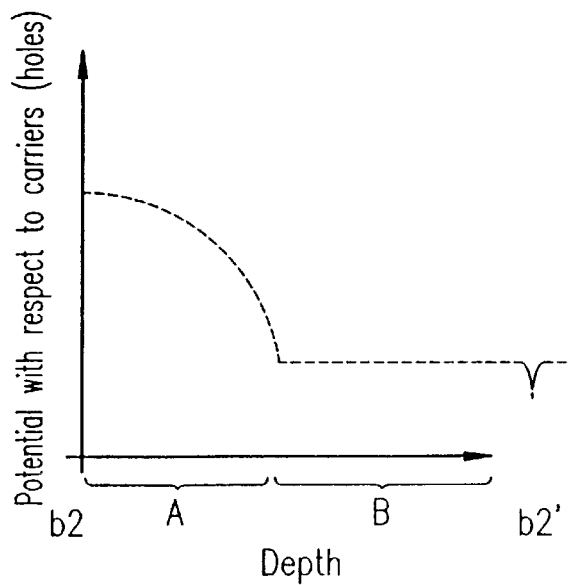
FIGS. 8A and 8B are diagrams respectively illustrating a potential distribution and a structure when the N-type diffusion layer 7 is formed at a deep level in the divided photodiode of the fourth example.
Figure 8B:
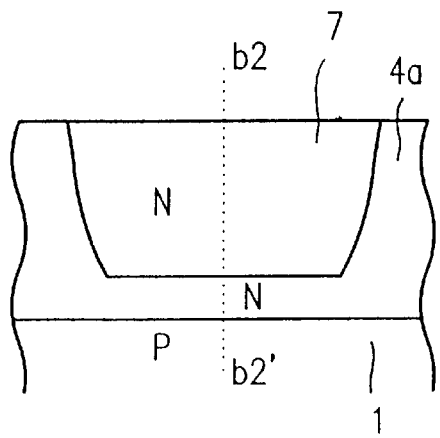

Furthermore, in the case where the N-type diffusion layer 7 is formed at a deeper level (see FIG. 8B), a flat region B where a potential is flat with respect to holes becomes shorter (see FIGS. 7A and 8A) as compared with a case where the N-type diffusion layer 7 is formed at a shallower level (see FIG. 7B). In the inclined regions A where the potential is inclined due to the concentration gradients in FIGS. 7A and 8A, a drift is caused by the internal electric field generated by the potential slope so that the mobility of the optical carriers is accelerated. On the other hand, in the flat regions B where the potential is flat, since there is no internal electric field generated by the potential slope, the carriers move only by diffusion, and the mobility of these carriers becomes slower. This means that if the N-type diffusion layer 7 is formed at a deeper level, the length of the flat region B where the potential is flat and the mobility of the carriers becomes slower can be shortened. As a result, the response speed can also be improved in view of the diffusion current. It is noted that FIGS. 7A and 8A illustrate the potential distributions with respect to holes which are measured along the line b1–b1' of the light-detecting photodiode section shown in FIG. 7B and the line b2–b2' of the light-detecting photodiode section shown in FIG. 8B, respectively.

As described above, the N-type diffusion layer 7 may be formed during the same process step for forming the base region 55b (see FIG. 2) of the vertical type PNP transistor formed in the signal processor circuit section. Alternatively, the N-type diffusion layer 7 may have a structure in which a first N-type diffusion layer formed during the same process step for forming an N-type diffusion layer diffusing to a shallow level and functioning as an emitter of an NPN transistor, and a second N-type diffusion layer formed during the same process step for forming an N-type diffusion layer diffusing to a deep level and functioning as a base region of a vertical type PNP transistor, overlap with each other. In such a case, the same effects as those described above can also be attained.

EXAMPLE 5

Figure 9:
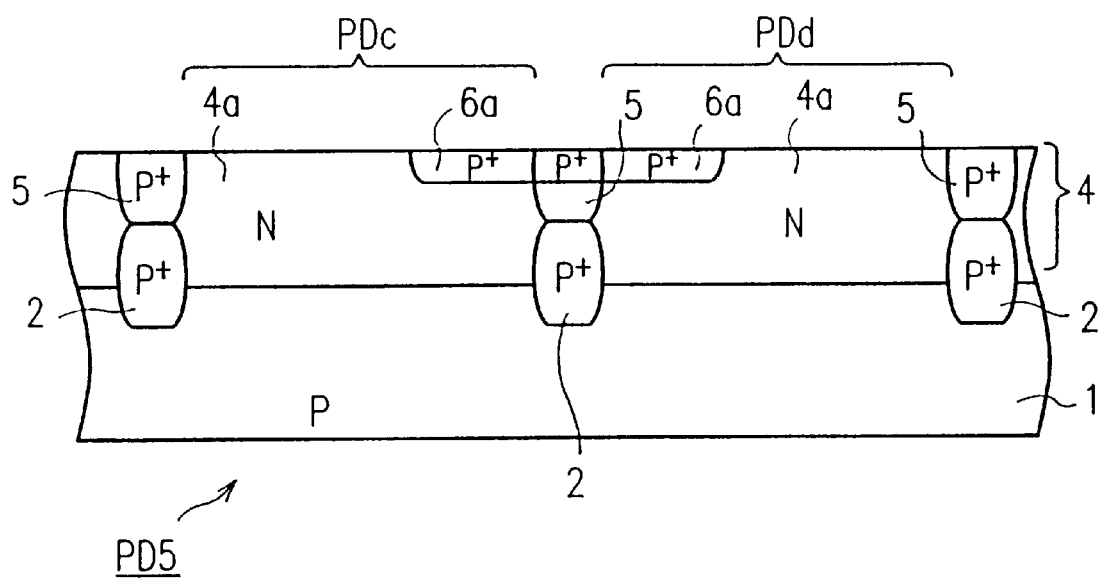
FIG. 9 is a view showing the cross-sectional structure of a divided photodiode in a circuit-integrating light-receiving element in a fifth example of the present invention.

FIG. 9 is a cross-sectional view of a divided photodiode incorporated into a circuit-integrating light-receiving element in a fifth example of the present invention, showing a part corresponding to the cross-sectional part of the divided photodiode shown in FIG. 1B. It is noted that an oxide film or a nitride film and various components including multilayer wires, a protective film and the like to be formed during the respective steps succeeding a metal processing step are omitted from FIG. 9.

In this figure, PD5 is a divided photodiode of the fifth example, from which the N$^+$-type diffusion layer 3a of the divided photodiode PD2 of the second example has been omitted. The remaining configuration thereof is the same as that of the second example.

Next, the functions or the effects to be attained in the present example will be described.

The divided photodiode PD5 having this structure is effectively applicable to a case where the wavelength of a laser beam emitted by a semiconductor laser device used as a light-emitting element for an optical pickup is short, in the same way as in the fourth example. The reasons are as follows. If the wavelength of a laser beam emitted by the employed semiconductor laser device is short, the penetration depth of signal light incident onto a circuit-integrating light-receiving element (i.e., how far the signal light penetrates through the circuit-integrating light-receiving element) becomes shallower. Thus, when a semiconductor laser beam for reading out an RF signal is irradiated onto the divided photodiode, fewer optical carriers are generated from a deep level from the light-receiving surface of the divided photodiode. In such a case, even when the N$^+$-type diffusion layer 3a is not formed, the response is less likely to be delayed because of the detour of the optical carriers around the division section. Thus, even if the N$^+$-type diffusion layer 3a is formed in the vicinity of the division section, the response is not delayed, and it is not necessary to form the P$^+$-type diffusion layer 6a, either.

If the P$^+$-type diffusion layer 6a is not formed, the optical carriers generated at a shallow level in the N-type epitaxial layer 4 move by diffusion to the junction between the N-type epitaxial layer 4 and the P-type silicon substrate 1. On the other hand, if the P$^+$-type diffusion layer 6a is formed, the generated optical carriers move by diffusion toward a nearer one of the junction between the P-type silicon substrate 1 and the N-type epitaxial regions 4a and the junction between the P$^+$-type diffusion layer 6a and the N-type epitaxial regions 4a. Thus, in such a case, the diffusion-movement distance of the generated optical carriers can be shortened and the response speed can be improved, as compared with the case where the P$^+$-type diffusion layer 6a is not formed.

Thus, it can be understood that a structure in which the N$^+$-type diffusion layer 3a is not formed but the P$^+$-type diffusion layer 6a is formed is excellent in response speed and junction capacitance, if the wavelength of a laser beam emitted by the employed semiconductor laser device is short. Nevertheless, if the P$^+$-type diffusion layer 6a is formed, the capacitance of the divided photodiode is increased by the junction capacitance between the P$^+$-type diffusion layer 6a and the N-type epitaxial regions 4a, and the level of radio frequency noise is raised.

Thus, it is necessary not only to satisfy the above-described conditions for improving the response speed in the area of the divided photodiode onto which the signal light is irradiated, but also to form the P$^+$-type diffusion layer 6a having the smallest possible area.

In view of these respects, it can be seen that it is sufficient to form the P$^+$-type diffusion layer 6a only under the area of the divided photodiode onto which the signal light is irradiated at the time of reading out an RF signal and which requires high-speed processing as described in the second example, if the wavelength of a laser beam emitted by the employed semiconductor laser device is short.

Thus, the divided photodiode PD5 of the fifth example shown in FIG. 9 is inferior to the structure of the fourth example in respect of the level of radio frequency noise, but is as effective as the structure of the fourth example in improving the response speed, as compared with the divided photodiode PD20 having a conventional structure shown in FIGS. 10A and 10B.

As is apparent from the foregoing description, according to one aspect of the present invention, the divided photodiode is configured such that the second semiconductor layer of the second conductivity type is formed only in the vicinity of the division section over the semiconductor substrate of the first conductivity type and the second semiconductor layer of the first conductivity type is formed so as to cover the upper part of the second semiconductor layer of the second conductivity type. Thus, as compared with a conventional divided photodiode, the junction area can be reduced. The reduction in junction area in turn reduces the junction capacitance and the level of radio frequency noise. In addition, in the divided photodiode of the present invention, since the second semiconductor layer of the second conductivity type for shortening the diffusion-movement distance of the optical carriers making a detour to diffuse around the division section is formed in the vicinity of the division section onto which the signal light is irradiated and in which a higher response speed is required, the decrease in response speed in the division section can be avoided.

In one embodiment of the present invention, the signal light for reading out an RF signal requiring higher response characteristics is in actuality not irradiated onto the entire area of the division section. Thus, by forming the second semiconductor layer of the first conductivity type for absorbing the optical carriers only in the division section irradiated with the signal light and in the vicinity thereof, over an area substantially equal to the beam diameter of the signal light, and by forming the second semiconductor layer of the second conductivity type for shortening the diffusion-movement distance of the optical carriers only in the vicinity of the dividing section so as not to outgrow the second semiconductor layer of the first conductivity type, the junction area in the divided photodiode can be further reduced and the capacitance thereof can also be reduced. Consequently, the level of radio frequency noise can also be reduced by the decrement of the capacitance.

Furthermore, in the area which requires higher response characteristics and onto which the signal light actually impinges, the second semiconductor layer of the second conductivity type is formed so as to be located in the vicinity of the division section, as in a conventional divided photodiode. Thus, the delay resulting from the detour of the optical carriers around the division section can be avoided and the decrease in response speed can be prevented.

In another embodiment of the present invention, the second semiconductor layer of the second conductivity type is formed only in the vicinity of the dividing section onto which the signal light is irradiated so as to have a planar pattern satisfying a minimum size complying with a design rule of a fabrication process, and the second semiconductor layer of the first conductivity type is formed so as to cover an upper part of the second semiconductor layer of the second conductivity type. Consequently, the junction area can be further reduced, so that the capacitance of the divided photodiode and the level of radio frequency noise can be further reduced. In this case, since the region onto which the signal light is irradiated includes a region in which the second semiconductor layer of the first conductivity type and the second semiconductor layer of the second conductivity type are not formed, the response speed is decreased to a certain degree. However, as compared with a structure not including these semiconductor layers, this structure is also excellent in response speed. Thus, in the case where it is critical to reduce the level of radio frequency noise, this structure is sufficiently useful.

According to another aspect of the present invention, a third semiconductor layer of the second conductivity type is formed by diffusing the impurity from the surface of the first semiconductor layer of the second conductivity type. Thus, by utilizing the potential slope represented by the concentration gradient in the third semiconductor layer of the second conductivity type, the diffusion-movement distance of the optical carriers generated in the first semiconductor layer of the second conductivity type can be shortened and the response speed can be improved.

That is to say, if the wavelength of a laser beam emitted by an employed semiconductor laser device is short, a smaller number of optical carriers are generated at a deep level as viewed from the light-receiving surface of the divided photodiode. Thus, it is not necessary to form the second semiconductor layer of the first conductivity type and the second semiconductor layer of the second conductivity type. When these layers are not formed, the junction capacitance of the divided photodiode becomes minimum. However, in such a case, the optical carriers generated in the first semiconductor layer of the second conductivity type diffuse to reach the junction region between the first semiconductor layer of the second conductivity type and the semiconductor substrate of the first conductivity type, so that the response speed becomes slower. Thus, a third semiconductor layer of the second conductivity type is formed by diffusing an impurity from the surface of the first semiconductor layer of the second conductivity type, thereby shortening the diffusion-movement distance of the optical carriers generated in the first semiconductor layer of the second conductivity type by the internal electric field of the third semiconductor layer of the second conductivity type.

In one embodiment of the present invention, the third semiconductor layer of the second conductivity type is formed simultaneously with a base region of a vertical type PNP transistor. Thus, the depth of the P-N junction of the divided photodiode can be increased and the response speed can also be improved in respect of the diffusing current component. Furthermore, since the third semiconductor layer of the second conductivity type can be formed without increasing the number of process steps, the present invention is also advantageous in respect of manufacturing costs.

According to still another aspect of the present invention, the second semiconductor layer of the first conductivity type for absorbing the optical carriers is formed only in the division section of the divided photodiode, onto which the signal light is irradiated, and in the surface region in the vicinity thereof. Consequently, the diffusion-movement distance of the optical carriers generated in the divided photodiode can be shortened and the response speed can be improved.

Specifically, in the case where the wavelength of a laser beam emitted by an employed semiconductor laser device is short, only the second semiconductor layer of the first conductivity type is formed over an area substantially equal to the beam diameter of the irradiated signal light only in the division section and in the vicinity thereof, and the second semiconductor layer of the second conductivity type for shortening the diffusion-movement distance of the optical carriers making a detour around the division section is not formed. In such a case, though the capacitance of the divided photodiode is slightly increased as compared with a case where the second semiconductor layer of the first conductivity type does not exist, the optical carriers generated in the first semiconductor layer of the second conductivity type can be absorbed by the second semiconductor layer of the first conductivity type, and the response speed does not become slower.

In other words, when the second semiconductor layer of the first conductivity type is not formed, the optical carriers generated in the first semiconductor layer of the second conductivity type reach the junction region between the first semiconductor layer of the second conductivity type and the semiconductor substrate of the first conductivity type. However, since the optical carriers move by diffusion, the response speed becomes slower. On the other hand, if the second semiconductor layer of the first conductivity type is formed, the optical carriers generated in the first semiconductor layer of the second conductivity type reach the nearer junction region between the second semiconductor layer of the first conductivity type and the first semiconductor layer of the second conductivity type. Consequently, the diffusion-movement distance becomes shorter and the response speed can be improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A circuit-integrating light-receiving element comprising:

a semiconductor substrate of a first conductivity type;

a first semiconductor layer of a second conductivity type formed over the semiconductor substrate of the first conductivity type;

a first semiconductor layer of the first conductivity type for dividing the first semiconductor layer of the second conductivity type into a plurality of semiconductor regions of the second conductivity type;

a region comprised of a plurality of light-detecting sections for detecting signal light and outputting photoelectrically converted signals of the signal light, wherein the plurality of light-detecting sections are constituted by the respectively divided semiconductor regions of the second conductivity type and underlying regions of the semiconductor substrate of the first conductivity type, a divided photodiode being composed of the plurality of light-detecting sections, and a circuit component constituting a signal processor circuit for processing the photoelectrically converted signals being formed in a region of the first semiconductor layer of the second conductivity type electrically isolated from the region where the divided photodiode is formed;

a second semiconductor layer of the second conductivity type formed proximate to the first semiconductor layer of the first conductivity type which functions as a division section of the divided photodiode, remote from an outer boundary of the region comprised of the plurality of light-detecting sections, and within the regions of the semiconductor substrate of the first conductivity type which form the respective light-detecting sections; and a second semiconductor layer of the first conductivity type formed in a surface region of the first semiconductor layer of the second conductivity type including a part of the first semiconductor layer of the first conductivity type functioning as the division section so as to cover an upper part of the second semiconductor layer of the second conductivity type.

2. A circuit-integrating light-receiving element according to claim 1, wherein the second semiconductor layer of the first conductivity type is formed only in the vicinity of the division section, onto which the signal light is irradiated, over an area substantially equal to a beam diameter of the signal light, and wherein the second semiconductor layer of the second conductivity type is formed such that a planar pattern of the second semiconductor layer of the second conductivity type does not outgrow a planar pattern of the second semiconductor layer of the first conductivity type.

3. A circuit-integrating light-receiving element according to claim 1, wherein the second semiconductor layer of the second conductivity type is formed only in the vicinity of the division section onto which the signal light is irradiated so as to have a planar pattern satisfying a minimum size complying with a design rule of a fabrication process, and wherein the second semiconductor layer of the first conductivity type is formed so as to cover an upper part of the second semiconductor layer of the second conductivity type.

4. A circuit-integrating light-receiving element according to claim 2, wherein the second semiconductor layer of the second conductivity type is formed only in the vicinity of the division section onto which the signal light is irradiated so as to have a planar pattern satisfying a minimum size complying with a design rule of a fabrication process, and wherein the second semiconductor layer of the first conductivity type is formed so as to cover an upper part of the second semiconductor layer of the second conductivity type.

5. A circuit-integrating light-receiving element comprising:

a semiconductor substrate of a first conductivity type;

a first semiconductor layer of a second conductivity type formed over the semiconductor substrate of the first conductivity type;

a first semiconductor layer of the first conductivity type for dividing the first semiconductor layer of the second conductivity type into a plurality of semiconductor regions of the second conductivity type;

a plurality of light-detecting sections for detecting signal light and outputting photoelectrically converted signals of the signal light being constituted by the respectively divided semiconductor regions of the second conductivity type and underlying regions of the semiconductor substrate of the first conductivity type, a divided photodiode being composed of the plurality of light-detecting sections, and a circuit component constituting a signal processor circuit for processing the photoelectrically converted signals being formed in a region of the first semiconductor layer of the second conductivity type electrically isolated from the region in which the divided photodiode is formed; and a second semiconductor layer of the first conductivity type formed in a surface region of the first semiconductor layer of the second conductivity type in a part of a division section constituted by the first semiconductor layer of the first conductivity type, onto which the signal light is irradiated, and in the vicinity of the division section so as to cover an area substantially equal to an area covered by the signal light;

wherein the area covered by the signal light is substantially less than an area covered by the plurality of light-detecting sections.

6. A circuit-integrating light-receiving element comprising:

a semiconductor substrate of a first conductivity type;

a first semiconductor layer of a second conductivity type formed over the semiconductor substrate of the first conductivity type;

a first semiconductor layer of the first conductivity type for dividing the first semiconductor layer of the second conductivity type into a plurality of semiconductor regions of the second conductivity type;

a plurality of light-detecting sections for detecting signal light and outputting photoelectrically converted signals of the signal light being constituted by the respectively divided semiconductor regions of the second conductivity type and underlying regions of the semiconductor substrate of the first conductivity type, a divided photodiode being composed of the plurality of light-detecting sections, and a circuit component constituting a signal processor circuit for processing the photoelectrically converted signals being formed in a region of the first semiconductor layer of the second conductivity type electrically isolated from the region in which the divided photodiode is formed; and a second semiconductor layer of the second conductivity type which extends from an upper surface of the semiconductor regions of the second conductivity type constituting the light-detecting sections into the semiconductor regions of the second conductivity type constituting the light-detecting sections, and which has an impurity concentration higher than an impurity concentration of the first semiconductor layer of the second conductivity type.

7. A circuit-integrating light-receiving element according to claim 6, wherein the second semiconductor layer of the second conductivity type is formed simultaneously with a base region of a vertical type PNP transistor functioning as the circuit component.

8. A circuit-integrating light-receiving element according to claim 6, wherein the second semiconductor layer of the second conductivity type is formed simultaneously with a base region of a vertical type PNP transistor functioning as the circuit component.

9. A circuit-integrating light-receiving element according to claim 6 wherein the second semiconductor layer of the second conductivity type is formed by diffusing an impurity from a surface of the semiconductor regions of the second conductivity type.

* * * * *